United States Patent
Chang et al.

(10) Patent No.: US 12,032,828 B2
(45) Date of Patent: *Jul. 9, 2024

(54) COORDINATED IN-MODULE RAS FEATURES FOR SYNCHRONOUS DDR COMPATIBLE MEMORY

(71) Applicant: Samsung Electronics Co., Ltd., Suwon-si (KR)

(72) Inventors: Mu-Tien Chang, Santa Clara, CA (US); Dimin Niu, Sunnyvale, CA (US); Hongzhong Zheng, Los Gatos, CA (US); Sun Young Lim, Gyeonggi-do (KR); Indong Kim, Kyunggi-Do (KR); Jangseok Choi, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/713,228

(22) Filed: Apr. 4, 2022

(65) Prior Publication Data

US 2022/0229551 A1 Jul. 21, 2022

Related U.S. Application Data

(63) Continuation of application No. 16/819,032, filed on Mar. 13, 2020, now Pat. No. 11,294,571, which is a (Continued)

(51) Int. Cl.
*G06F 12/00* (2006.01)
*G06F 3/06* (2006.01)
(Continued)

(52) U.S. Cl.
CPC ............ *G06F 3/061* (2013.01); *G06F 3/0619* (2013.01); *G06F 3/0625* (2013.01);
(Continued)

(58) Field of Classification Search
None
See application file for complete search history.

(56) References Cited

U.S. PATENT DOCUMENTS

| 5,737,258 A | 4/1998 | Choi et al. |
| 5,907,867 A | 5/1999 | Shinbo et al. |

(Continued)

FOREIGN PATENT DOCUMENTS

| CN | 1311509 A | 9/2001 |
| CN | 1503974 A | 6/2004 |

(Continued)

OTHER PUBLICATIONS

Final Office Action for U.S. Appl. No. 15/213,386, dated Jan. 11, 2019.

(Continued)

*Primary Examiner* — Daniel D Tsui
(74) *Attorney, Agent, or Firm* — Renaissance IP Law Group LLP

(57) ABSTRACT

A memory module includes a memory array, an interface and a controller. The memory array includes an array of memory cells and is configured as a dual in-line memory module (DIMM). The DIMM includes a plurality of connections that have been repurposed from a standard DIMM pin out configuration to interface operational status of the memory device to a host device. The interface is coupled to the memory array and the plurality of connections of the DIMM to interface the memory array to the host device. The controller is coupled to the memory array and the interface and controls at least one of a refresh operation of the memory array, control an error-correction operation of the memory array, control a memory scrubbing operation of the memory array, and control a wear-level control operation of the array, and the controller to interface with the host device.

20 Claims, 13 Drawing Sheets

Related U.S. Application Data continuation of application No. 15/213,386, filed on Jul. 18, 2016, now Pat. No. 10,592,114.

(60) Provisional application No. 62/347,569, filed on Jun. 8, 2016, provisional application No. 62/303,352, filed on Mar. 3, 2016, provisional application No. 62/303,349, filed on Mar. 3, 2016, provisional application No. 62/303,347, filed on Mar. 3, 2016, provisional application No. 62/303,343, filed on Mar. 3, 2016.

(51) Int. Cl.
*G06F 11/10* (2006.01)
*G11C 29/52* (2006.01)
*G11C 5/04* (2006.01)
*G11C 11/406* (2006.01)
*G11C 29/04* (2006.01)

(52) U.S. Cl.
CPC .......... *G06F 3/0652* (2013.01); *G06F 3/0653* (2013.01); *G06F 3/0673* (2013.01); *G06F 11/106* (2013.01); *G11C 29/52* (2013.01); *G11C 5/04* (2013.01); *G11C 11/40611* (2013.01); *G11C 2029/0409* (2013.01); *G11C 2029/0411* (2013.01)

(56) References Cited

U.S. PATENT DOCUMENTS

| | | | |
|---|---|---|---|
| 6,154,821 A | 11/2000 | Barth et al. | |
| 6,445,624 B1 | 9/2002 | Janzen et al. | |
| 6,735,037 B1 | 5/2004 | Tanaka et al. | |
| 7,062,618 B2 | 6/2006 | Tsunoda et al. | |
| 7,269,709 B2 | 9/2007 | Kelly | |
| 7,386,768 B2 | 6/2008 | Vogt et al. | |
| 7,421,558 B2 | 9/2008 | Choi et al. | |
| 7,620,783 B2 | 11/2009 | Wolford et al. | |
| 7,716,411 B2 | 5/2010 | Panabaker et al. | |
| 7,917,688 B2 | 3/2011 | Tanaka et al. | |
| 8,064,250 B2 | 11/2011 | Abdulla | |
| 8,130,574 B2 | 3/2012 | Ngo et al. | |
| 8,261,136 B2 | 9/2012 | D'Abreu et al. | |
| 8,359,521 B2 | 1/2013 | Kim et al. | |
| 8,588,017 B2 | 11/2013 | Park et al. | |
| 8,737,148 B2 | 5/2014 | Byom et al. | |
| 8,745,321 B2 | 6/2014 | Rajan et al. | |
| 8,924,639 B2 | 12/2014 | Ahn et al. | |
| 8,938,581 B2 | 1/2015 | Cho et al. | |
| 9,032,162 B1 | 5/2015 | Chang et al. | |
| 9,104,547 B2 | 8/2015 | Baltar | |
| 9,214,199 B2 | 12/2015 | Brandl et al. | |
| 9,405,608 B2 | 8/2016 | Okubo et al. | |
| 9,460,791 B1 | 10/2016 | Shallal et al. | |
| 9,569,144 B2 | 2/2017 | Uematsu et al. | |
| 9,830,086 B2 | 11/2017 | Niu et al. | |
| 2001/0003198 A1 | 6/2001 | Wu | |
| 2004/0243753 A1 | 12/2004 | Horowitz et al. | |
| 2005/0066137 A1 | 3/2005 | Jeddeloh et al. | |
| 2005/0188137 A1 | 8/2005 | Fujiki | |
| 2006/0090054 A1 | 4/2006 | Choi et al. | |
| 2007/0162720 A1 | 7/2007 | Branda et al. | |
| 2008/0082750 A1 | 4/2008 | Okin et al. | |
| 2009/0037666 A1 | 2/2009 | Rahman et al. | |
| 2009/0168524 A1* | 7/2009 | Golov | G11C 16/349 365/185.09 |
| 2010/0005214 A1 | 1/2010 | Trombley et al. | |
| 2010/0110748 A1 | 5/2010 | Best | |
| 2012/0331356 A1 | 12/2012 | Vogt et al. | |
| 2014/0181364 A1 | 6/2014 | Berke et al. | |
| 2014/0192583 A1 | 7/2014 | Rajan et al. | |
| 2014/0237157 A1 | 8/2014 | Takefman et al. | |
| 2014/0359391 A1 | 12/2014 | Pawlowski | |
| 2015/0186042 A1 | 7/2015 | Lee | |
| 2015/0268959 A1 | 9/2015 | Krishna et al. | |
| 2015/0309742 A1 | 10/2015 | Amidi et al. | |
| 2016/0041861 A1* | 2/2016 | Chang | G06F 11/0751 714/57 |
| 2016/0085585 A1 | 3/2016 | Chen et al. | |

FOREIGN PATENT DOCUMENTS

| | | |
|---|---|---|
| CN | 101042929 A | 9/2007 |
| CN | 101751226 A | 6/2010 |
| CN | 103765392 A | 4/2014 |
| CN | 104050099 A | 9/2014 |
| CN | 104409097 A | 3/2015 |
| CN | 204332379 U | 5/2015 |
| JP | H08306195 A | 11/1996 |
| JP | 2001010865 A | 1/2001 |
| JP | 2001014842 A | 1/2001 |
| JP | 2003091463 A | 3/2003 |
| JP | 2005537543 A | 12/2005 |
| JP | 2008171163 A | 7/2008 |
| JP | 2009540431 A | 11/2009 |
| JP | 2010153018 A | 7/2010 |
| JP | 2011530734 A | 12/2011 |
| JP | 2012089137 A | 5/2012 |
| JP | 2012146360 A | 8/2012 |
| JP | 2014157391 A | 8/2014 |
| TW | I246081 B | 12/2005 |
| TW | 201015338 A | 4/2010 |
| TW | I711928 B | 12/2020 |
| WO | 2014143056 A1 | 9/2014 |
| WO | 2014155593 A1 | 10/2014 |
| WO | 2015089054 A1 | 6/2015 |

OTHER PUBLICATIONS

Notice of Allowance for U.S. Appl. No. 15/213,386, dated Oct. 23, 2019.
Notice of Allowance for U.S. Appl. No. 16/819,032, dated Nov. 26, 2021.
Office Action for U.S. Appl. No. 15/213,386, dated May 17, 2019.
Office Action for U.S. Appl. No. 15/213,386, dated Sep. 21, 2018.
Office Action for U.S. Appl. No. 16/819,032, dated Jul. 6, 2021.

* cited by examiner

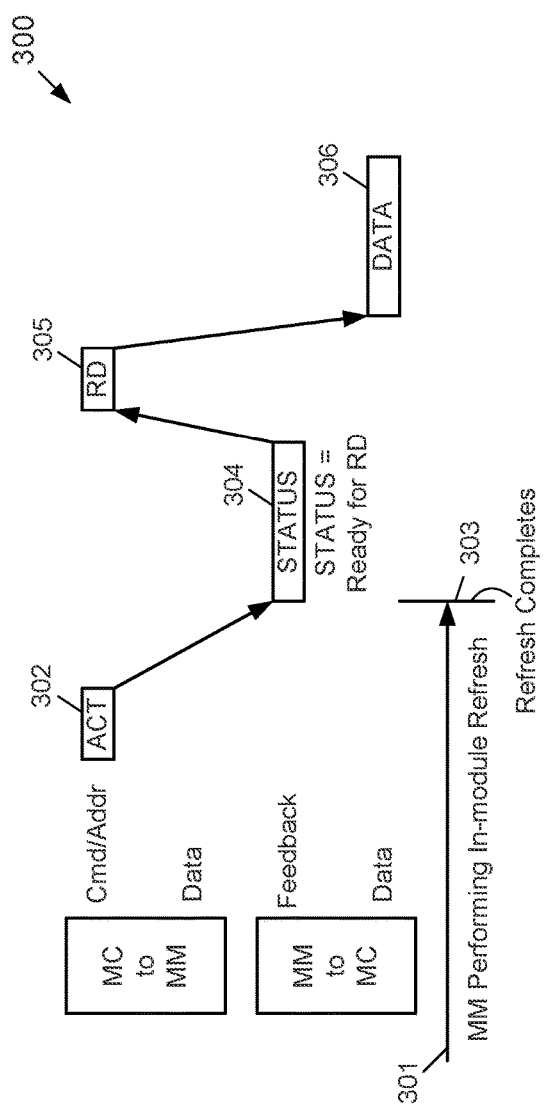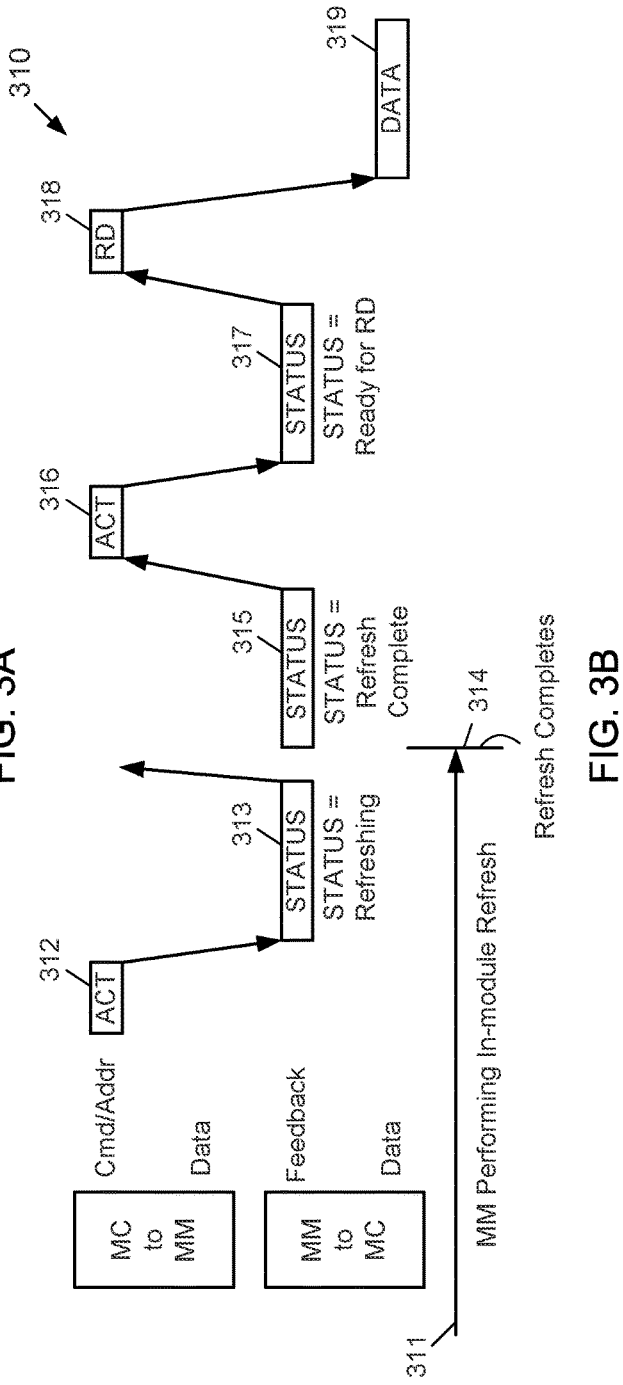

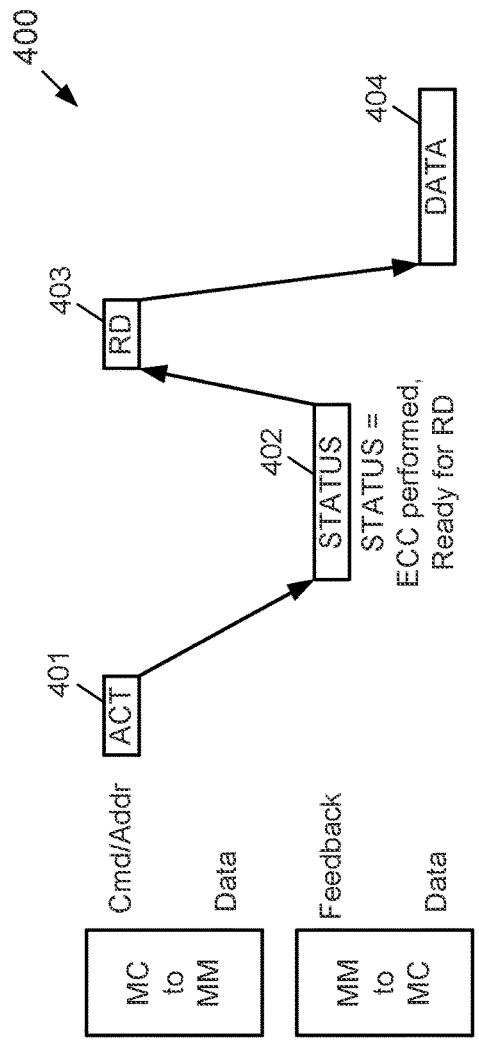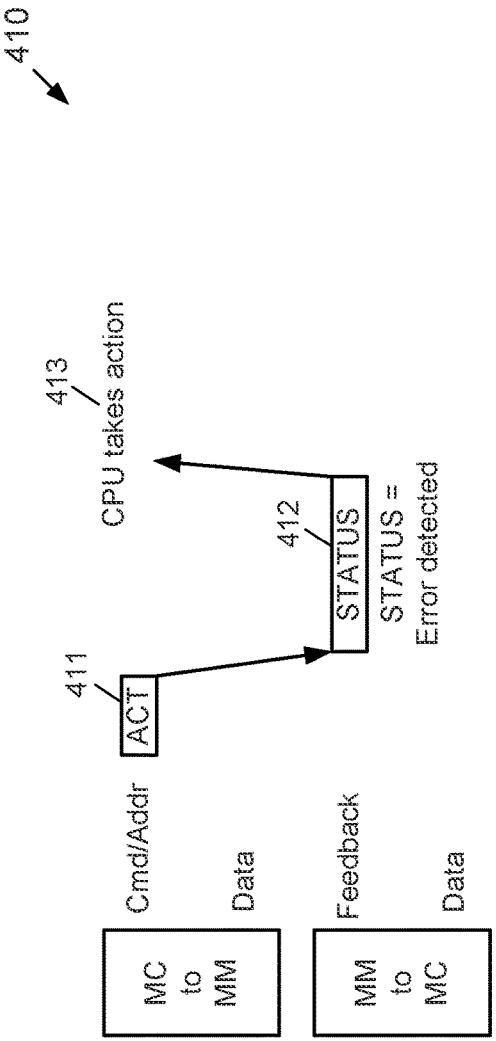
FIG. 4A
FIG. 4B

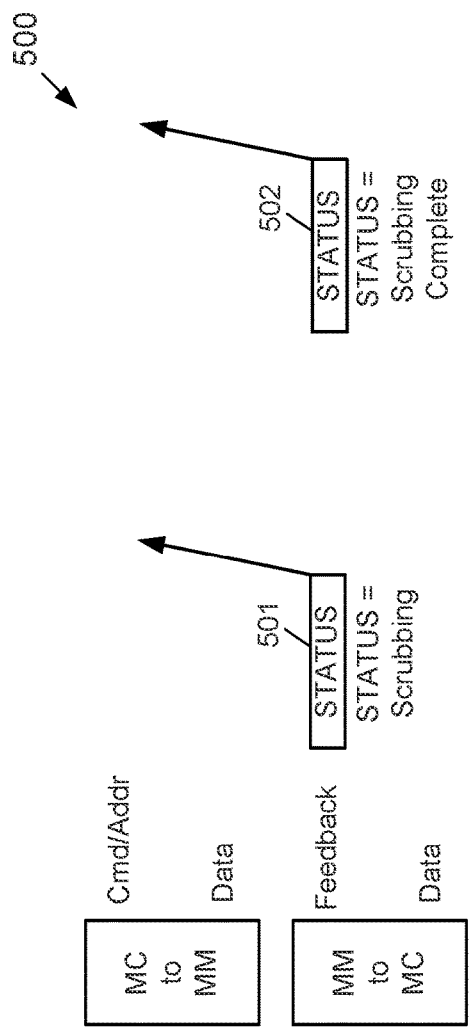
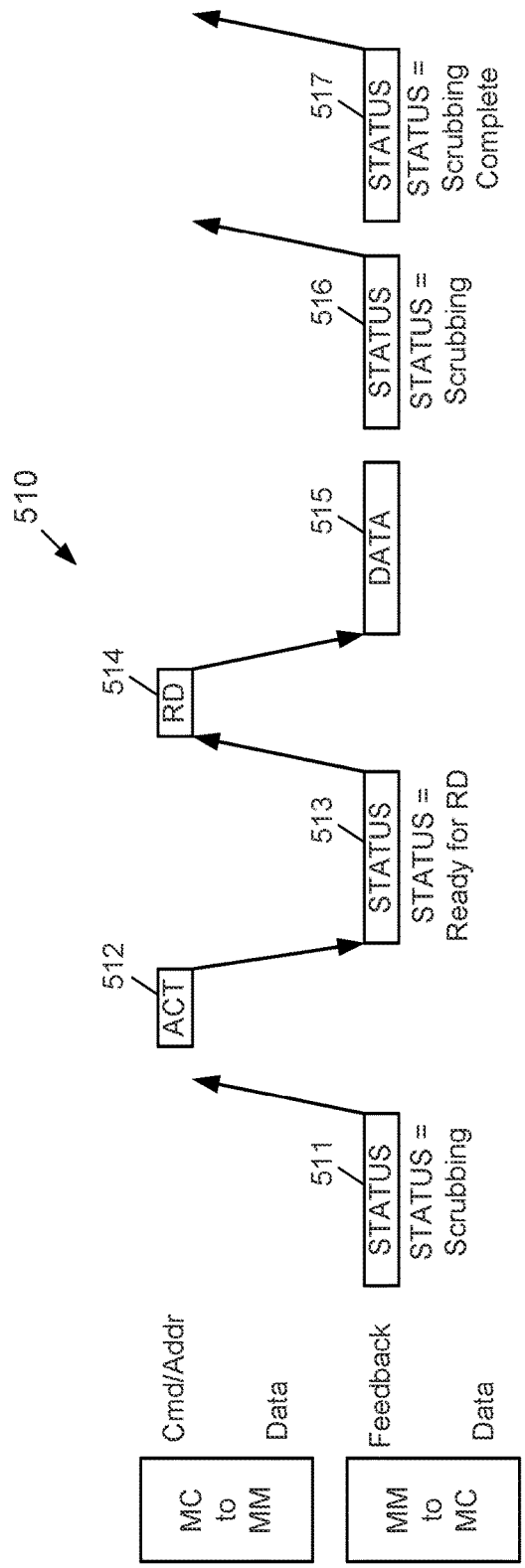
FIG. 5A
FIG. 5B

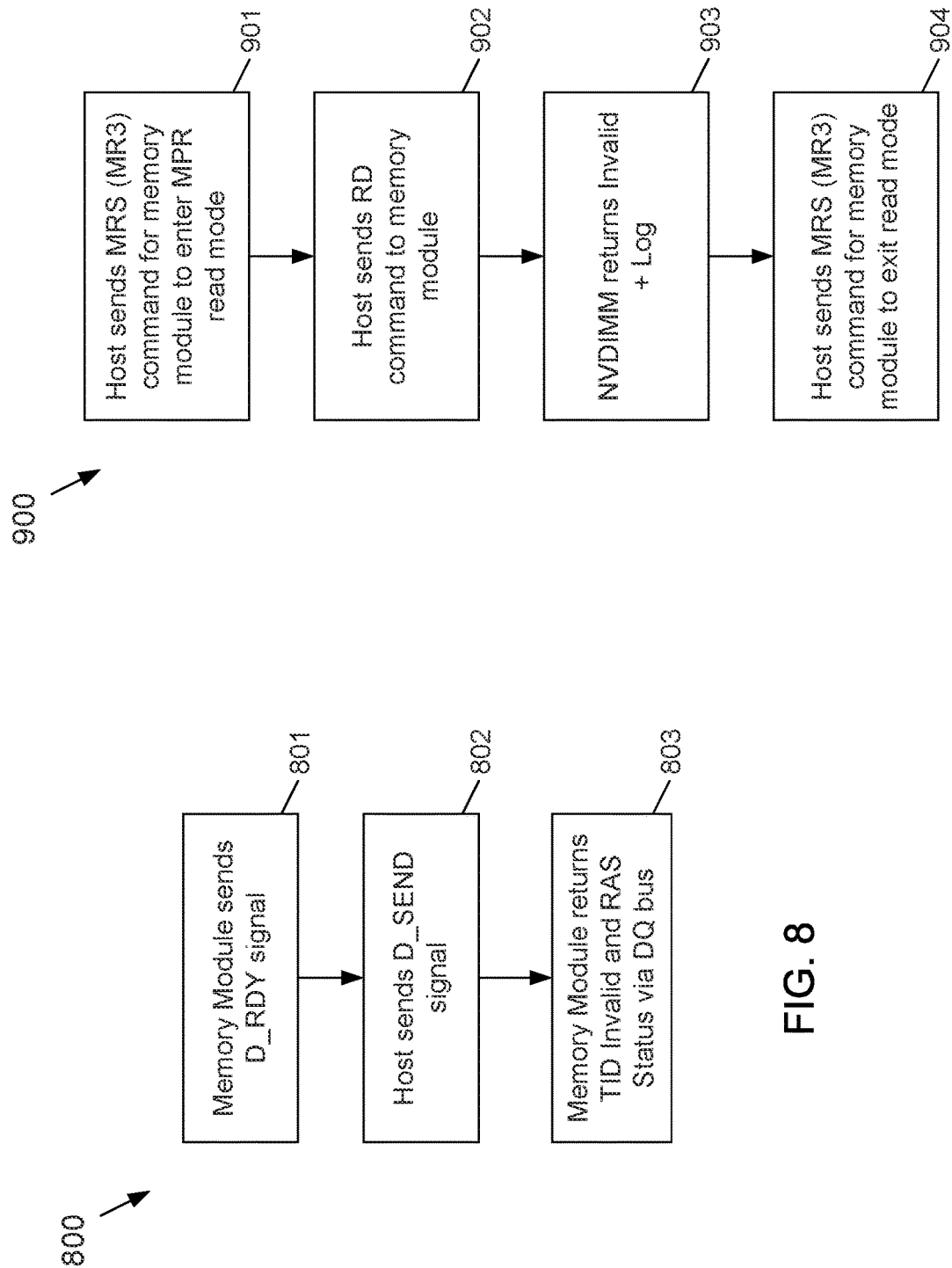

COORDINATED IN-MODULE RAS FEATURES FOR SYNCHRONOUS DDR COMPATIBLE MEMORY

CROSS-REFERENCE TO RELATED APPLICATIONS

This application is a continuation of U.S. patent application Ser. No. 16/819,032, filed on Mar. 13, 2020, which is a continuation of U.S. patent application Ser. No. 15/213,386, filed on Jul. 18, 2016, now issued as U.S. Pat. No. 10,592,114, granted on Mar. 17, 2020, which claims the priority benefit under 35 U.S.C. § 119(e) of U.S. Provisional Patent Application No. 62/303,352, filed on Mar. 3, 2016, and to U.S. Provisional Patent Application No. 62/347,569, filed on Jun. 8, 2016, the disclosure of both are incorporated herein by reference in their entirety. Additionally, U.S. patent application Ser. No. 15/213,386 claims the priority benefit under 35 U.S.C. § 119(e) of U.S. Provisional Patent Application Ser. No. 62/303,347, filed on Mar. 3, 2016, U.S. Provisional Patent Application Ser. No. 62/303,343, filed on Mar. 3, 2016, and U.S. Provisional Patent Application Ser. No. 62/303,349, filed on Mar. 3, 2016, the disclosures of each are incorporated by herein by reference.

TECHNICAL FIELD

The present disclosure relates to memory devices. More particularly, the present disclosure relates to a memory device comprising a memory module that supports and/or manages in-module refresh features, in-module ECC functionality, in-module scrubbing, and/or in-module wear-leveling management.

BACKGROUND

Memory reliability, availability and serviceability (RAS) features have been traditionally performed and/or managed at a system level by a central processing unit (CPU) and/or memory controller (MC). In some configurations, a CPU and a MC are separate components of a host system. In other configurations, the CPU and the MC are integral. As used herein, the acronym CPU/MC means a CPU and/or an MC. For example, a CPU/MC has traditionally sent a refresh command to dynamic random access memory (DRAM) of a system memory to initiate refresh of the DRAM. Error correction using an error correcting code (ECC) has also been traditionally performed by a CPU/MC reading individual memory locations, correcting data using the ECC and the rewriting the data. Another RAS feature that has been traditionally performed by a CPU/MC is "scrubbing" of the system memory in which the CPU/MC periodically reads regions of a system memory, corrects errors (using ECC) and writes corrected data back to the region of the system memory. Yet another RAS feature that has been traditionally performed by a CPU/MC is wear-leveling management in which a CPU/MC remaps memory pages of a non-volatile memory using, for example, a write-count table and a remap table to swap memory pages using read and write commands to balance wear in the non-volatile memory.

SUMMARY

An embodiment provides a memory module that may comprise a memory array, an interface coupled to the memory array to interface the memory array to a host device in which the interface may comprise a plurality of connections that have been repurposed from a standard dual in-line memory module pin out configuration to interface feedback status information of the memory device to the host device, and a controller coupled to the memory array and the interface in which the controller may be to control at least one of a refresh operation of the memory array, control an error-correction operation of the memory array, control a memory scrubbing operation of the memory array, and control a wear-level control operation of the array, and the controller may be to receive a command through the interface from the host device and in response to the received command to provide the feedback status information to the host device through the interface relating to an operation controlled by the controller when the command was received.

Another embodiment provides a memory module that may comprise a memory array comprising an array of memory cells in which the array of memory cells may include dynamic random access memory (DRAM) and non-volatile random access memory (NVRAM) and the memory array may be configured as a dual in-line memory module (DIMM), and a controller coupled to the memory array, the controller may be to control at least one of a refresh operation of the memory array, an error-correction operation of the memory array, a memory scrubbing operation of the memory array, and a wear-level control operation of the array, and the controller may be to provide status information to a host device relating to an operation being controlled by the controller through an interface that may comprise a plurality of connections that have been repurposed from a standard dual in-line memory module pin out configuration.

An embodiment provides a memory module that may comprise a memory array comprising an array of memory cells in which the memory array may be configured as a dual in-line memory module (DIMM), and the DIMM may include a plurality of connections that have been repurposed from a standard DIMM pin out configuration to interface operational status of the memory device to a host device, an interface coupled to the memory array and the plurality of connections of the DIMM to interface the memory array to the host device, and a controller coupled to the memory array and the interface, the controller may be to control at least one of a refresh operation of the memory array, an error-correction operation of the memory array, a memory scrubbing operation of the memory array, and a wear-level control operation of the array and to provide feedback control information to the host device relating to the wear-level control operation.

BRIEF DESCRIPTION OF THE DRAWINGS

In In the the following section, the aspects of the subject matter disclosed herein will be described with reference to exemplary embodiments illustrated in the figures, in which:

FIG. 3A depicts an example embodiment of a signal sequence between a memory controller and a memory module to provide operational coordination as the memory module performs an in-module refresh operation according to the subject matter disclosed herein;

FIG. 3B depicts another example embodiment of a signal sequence between a memory controller and a memory module to provide operational coordination as the memory module performs an in-module refresh feature according to the subject matter disclosed herein;

FIG. 4A depicts an example embodiment of a signal sequence between a memory controller and a memory module to provide operational coordination as the memory module performs an in-module ECC operation according to the subject matter disclosed herein;

FIG. 4B depicts an example embodiment of a signal sequence between a memory controller and a memory module to provide operational coordination as the memory module performs an in-module ECC operation and in which an error correction failure occurs according to the subject matter disclosed herein;

FIG. 5A depicts an example embodiment of a signal sequence between a memory controller and a memory module to provide operational coordination as the memory module performs an in-module scrubbing operation according to the subject matter disclosed herein;

FIG. 5B depicts another example embodiment of a signal sequence between a memory controller and a memory module to provide operational coordination as the memory module performs an in-module scrubbing operation according to the subject matter disclosed herein;

FIG. 8 depicts a flow diagram of a method in which an RAS feedback status message is communicated via a DQ bus according to the subject matter disclosed herein FIG. 9 depicts a flow diagram of a method of using an MRS command to configure a memory module to read an RAS feedback status message according to the subject matter disclosed herein;

DETAILED DESCRIPTION

Figure 1:
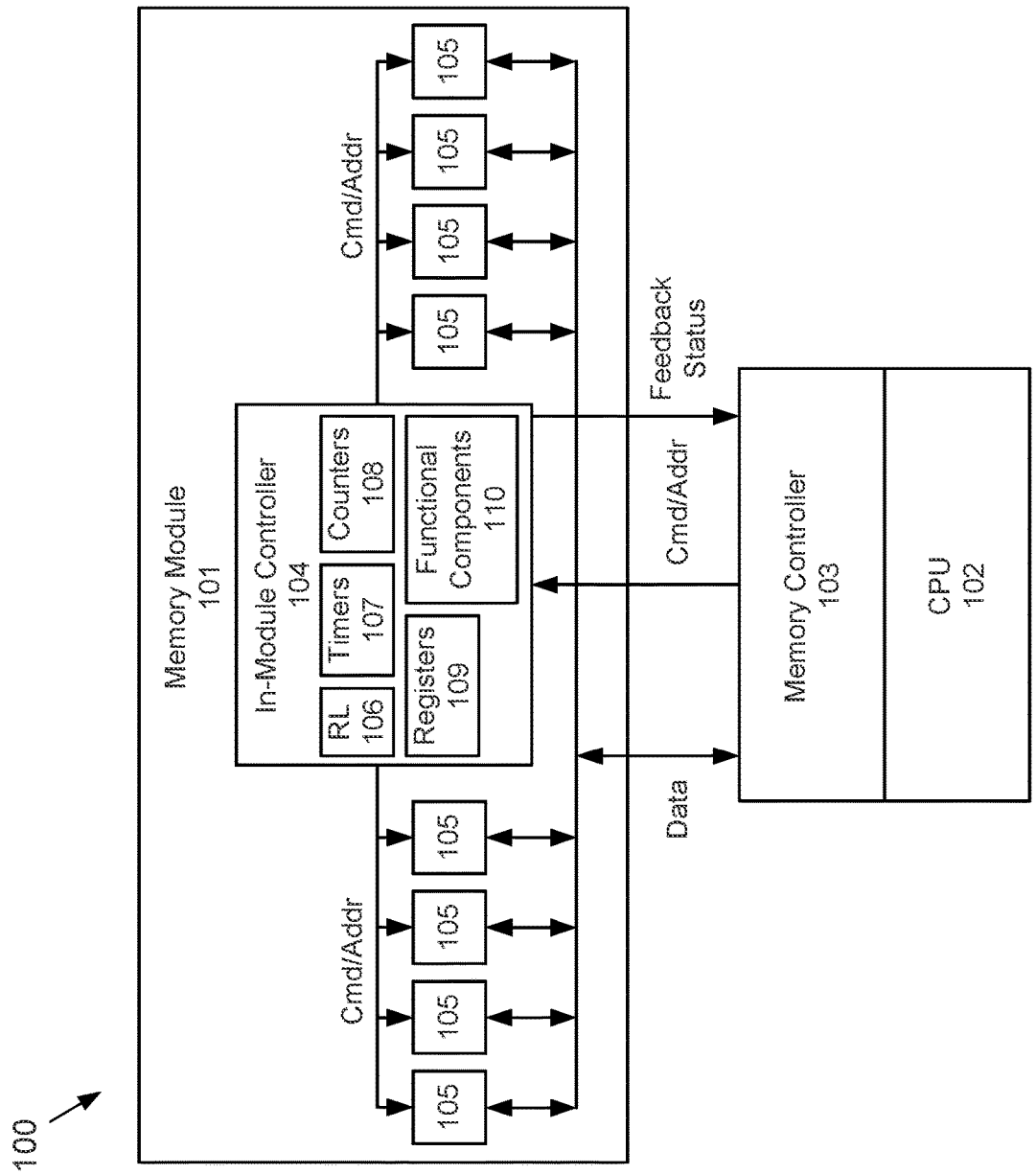
FIG. 1 depicts a functional block diagram of a system that includes an example embodiment of a memory module according to the subject matter disclosed herein.

The subject matter disclosed herein relates to a memory module that supports and/or manages in-module refresh features, in-module ECC functionality, in-module scrubbing, and/or in-module wear-leveling management and provides operational coordination with a host device.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment is included in at least one embodiment disclosed herein. Thus, the appearances of the phrases "in one embodiment" or "in an embodiment" or "according to one embodiment" (or other phrases having similar import) in various places throughout this specification are not necessarily all referring to the same embodiment. As used herein, the word "exemplary" means "serving as an example, instance, or illustration." Any embodiment described herein as "exemplary" is not to be construed as necessarily preferred or advantageous over other embodiments. Furthermore, the particular features, structures, or characteristics may be combined in any suitable manner in one or more embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

As used herein, the term "module" means circuitry that individually or collectively may be embodied as part of a larger system, for example, but not limited to, an integrated circuit (IC), an assembly comprising circuitry embodied as one or more integrated circuits, a system-on-chip (SoC), and so forth. As used herein, the terms and acronyms "central processing unit," "CPU," "memory controller," "MC," and "CPU/MC" refer to one or more devices that provide host system functionality of a CPU and/or an MC. It should also be understood that the terms and acronyms "central processing unit," "CPU," "memory controller," "MC," and "CPU/MC" are interchangeable depending on context.

The subject matter disclosed herein relates to a memory module that supports and/or manages in-module refresh features, in-module ECC functionality, in-module scrubbing, and/or in-module wear-leveling management and provides operational coordination with a host device. In one embodiment, a memory module as disclosed herein provides coordination between the memory module and a CPU/MC to maintain and/or enhance performance, power consumption, system health and reliability of system memory using in-module RAS features. In one embodiment, a memory module that provides in-module RAS features may be embodied as a dual in-line memory module (DIMM). In one embodiment, a memory module according to the subject matter disclosed herein provides coordination options that are selectably configurable at initialization, and provides contents of a report mechanism that are selectable and that may be used by a host CPU/MC to, for example, optimize system performance and/or system power consumption.

FIG. 1 depicts a functional block diagram of a system 100 that includes an example embodiment of a memory module 101 according to the subject matter disclosed herein. In addition to the memory module 101, system 100 includes a host system CPU 102. The system CPU 102 may include a memory controller 103 that is integral with the CPU 101. Alternatively, the memory controller 103 may be separate from the CPU 102.

The memory module 101 may be embodied as a non-volatile dual in-line memory module (NVDIMM) that is compatible with synchronous double data rate (DDR). In another embodiment, the memory module 101 may be embodied as a NVDIMM that is compatible with synchronous DDR4. In yet an alternative embodiment, memory module 101 may be embodied in a configuration that is different from a DIMM.

The memory module 101 and the CPU 102/MC 103 are communicatively coupled to each other in operation by an interface through which the CPU 102/MC 103 sends commands and addresses (Cmd/Addr) and data to the memory module 101, and the memory module 101 sends data and RAS feedback status information (or messages) to the CPU 102/MC 103. The RAS feedback status information may be used to coordinate the RAS features provided by the memory module 101 with the operation of the CPU 102/MC 103.

The memory module 101 includes an in-module controller 104 and a plurality of memory chips 105 that may be configured in one embodiment as non-volatile memory chips. In one embodiment, each memory chip 105 may be configured to include an array of non-volatile memory cells. In an alternative embodiment, the memory chips 105 may be configured as DRAM memory chips in which each memory chip 105 may be configured to include an array of DRAM memory cells. In yet another alternative embodiment, the memory chips 105 may be configured as a combination of one or more non-volatile memory cell arrays, such as non-volatile random access memory (NVRAM) and one or more DRAM memory cell arrays. In still another alternative embodiment, one or more of the memory chips 105 may be configured to include one or more dynamic random access memory field programmable gate arrays (DRAM-FPGAs).

The in-module controller 104 receives and processes command and address information from the CPU 102/MC 103, and communicates the command and address information to the plurality of memory chips 105. Data is bi-directionally communicated between the CPU 102/MC 103 and the plurality of memory chips 105. In one embodiment, the data path may pass through the in-module controller 104, and in another embodiment, the data may pass through a path that does not include the in-module controller 104.

The in-module controller 104 may be configured to provide one or more in-module RAS features, such as, an in-module refresh feature, an in-module ECC feature, an in-module scrubbing feature and/or an in-module wear-leveling feature. The in-module controller 104 may comprise refresh logic (RL) 106, one or more timers 107, one or more counters 108, one or more registers 109 and/or other functional components 110, such as, but not limited to tables, drivers, memory arrays and logic, that enable the in-module controller 104 to provide the one or more in-module RAS features. In one embodiment, the in-module controller 104 may be configured to provide RAS feedback status information relating to the in-module RAS features to the CPU 102/MC 103 that coordinates operation of memory module 101 and the CPU 102/MC 103. In another embodiment, the memory module may be configured to provide RAS feedback status information through the data path, as described in connection with FIGS. 7-10.

In an embodiment in which the memory module 101 is configured as a NVDIMM, the memory module 101 may include pins (or connections) on a connector that have been repurposed to communicate the RAS feedback status information relating to the in-module RAS features provided by the memory module 101. For example, in one embodiment, five (5) pins of a memory module connector may be repurposed to communicate RAS feedback status information. In another embodiment, eight (8) pins of a memory module connector may be repurposed to communicate RAS feedback status information. In still another embodiment, the number of repurposed connector pins may be different from the example five or eight pins of a memory module connector according to the subject matter disclosed herein. As used herein, the terms "repurpose" and "repurposed" mean that both the functionality and the signal direction of a connector pin have been changed from a previously established functionality and signal direction for that pin.

Figure 2:
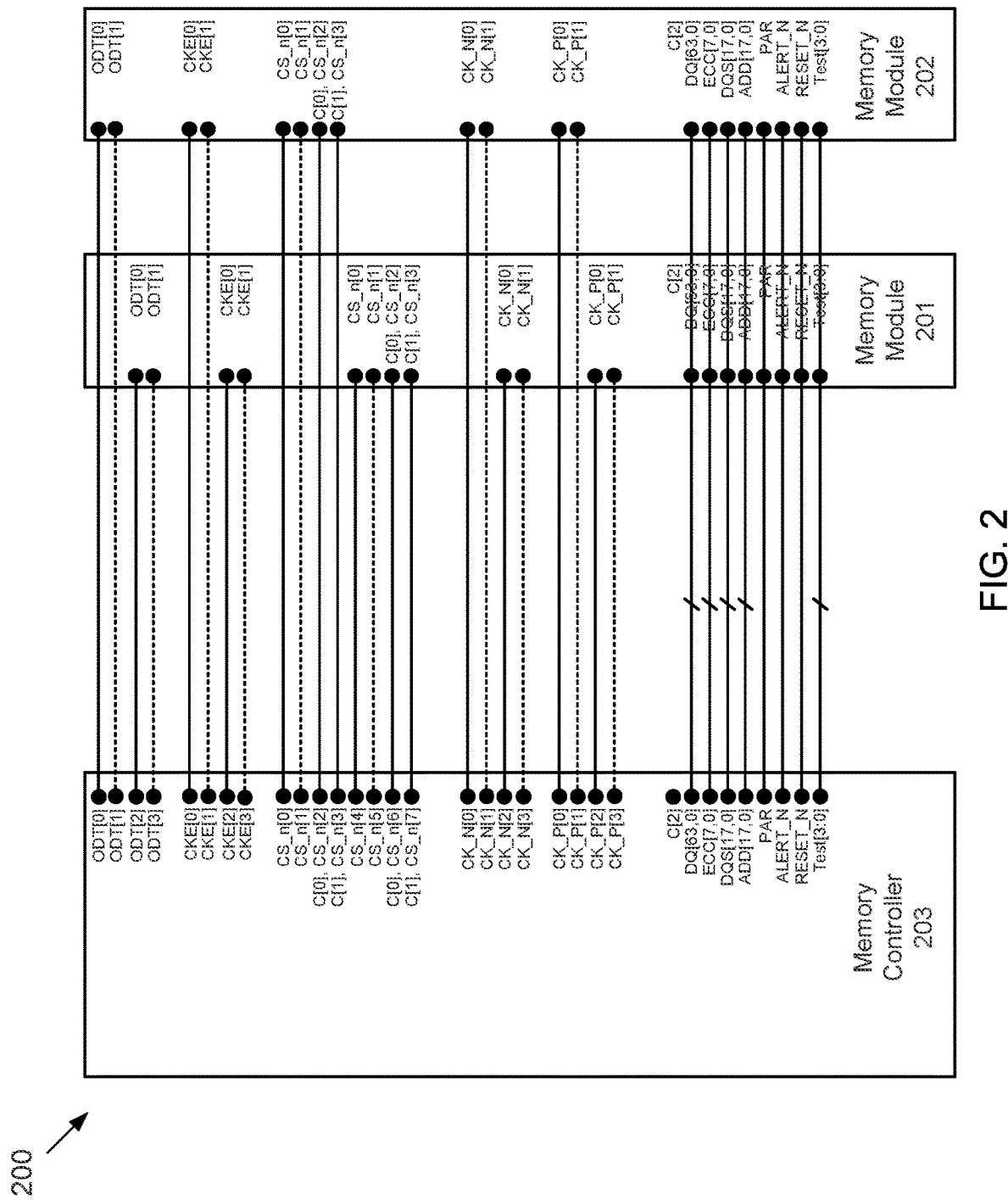
FIG. 2 depicts pinouts of an example embodiment of the memory module connector in a memory channel in which selected pins have been repurposed to communicate RAS feedback status information according to the subject matter disclosed herein.

FIG. 2 depicts pinouts of an example embodiment of a memory module connector in a memory channel 200 in which selected pins have been repurposed to communicate RAS feedback status information according to the subject matter disclosed herein. More specifically, FIG. 2 depicts pinouts of an example embodiment of two memory modules 201 and 202 of a communication channel 200 in which five (5) pins of the memory module connectors of the memory modules 201 and 202 have been repurposed to communicate RAS feedback status information to a memory controller 203. Although FIG. 2 depicts a memory controller 203, it should be understood the memory controller 203 could be replaced by a CPU and/or a CPU having an integral memory controller.

As depicted by dotted lines in FIG. 2, five example connector pins ODT[1], CKE[1], CS_n[1], CK_N[1] and CK_P[1] have been repurposed to communicate RAS feedback status information to the memory controller 203. In an embodiment in which eight connector pins have been repurposed to communicate RAS feedback status information to a memory controller, example connector pins may include ODT[1], CKE[1], CS_n[1], CK_N[1], CK_P[1], RFU[144] (not shown), RFU[205] (not shown) and RFU[207] (not shown). It should be understood that other connector pins of a memory module could be repurposed to communicate RAS feedback status information to a memory controller according to the subject matter disclosed herein. Additional details relating to repurposed connector pins are provided in U.S. Provisional Patent Application Ser. No. 62/303,349, filed Mar. 3, 2016, the disclosure of which is incorporated herein by reference in its entirety.

The number of cycles over which the RAS feedback status information is communicated may be determined by the particular memory module and/or may be selectively configured by a CPU/MC at initialization of the memory module. The specific configuration of RAS feedback status information that is communicated may vary depending on the number of cycles over which the RAS feedback status information is communicated. For example, if five (5) connector pins are repurposed, such as depicted in FIG. 2, in one embodiment the RAS feedback status information may be transferred over three (3) cycles. In this case, the RAS feedback status information may include 15 bits of information. As another example in which eight (8) connector pins are repurposed, the RAS feedback status information may include 16 bits of information and use two (2) cycles to transfer the RAS feedback status information. It should be understood that the number of cycles and/or the number of bits conveying RAS feedback status information is not limited to the examples that are disclosed herein.

RAS feedback status information may be used to coordinate operation between the memory module and the CPU/MC by notifying the CPU/MC about an invalid access and/or may be used to report logged statistics. Additionally, the RAS feedback status information may contain information that relates to categories of reason, address and hint, as described in more detail below in connection with Tables 2 and 4-7.

Table 1 sets forth some information for an example embodiment in which five connector pins have been repurposed and contrasting information for an example embodiment in which eight connector pins have been repurposed. Additional details relating repurposed connector pins are provided in previously mentioned U.S. Provisional Patent Application Ser. No. 62/303,349, filed Mar. 3, 2016, the disclosure of which is incorporated herein by reference in its entirety.

TABLE 1

Two example embodiments of connector pin repurposing.

| | 5 | 8 |
|---|---|---|
| Total Number of Pins Available for Feedback Status Information | | |
| Repurposed Pins for Feedback Status Information | ODT[1], CKE[1], CS_n[1], CK_N[1] and CK_P[1] | ODT[1], CKE[1], CS_n[1], CK_N[1], CK_P[1], RFU[144], RFU[205] and RFU[207] |
| Speed | Single Data Rate | Single Data Rate |
| Feedback Latency | 3 cycles | 2 cycles |
| Pin Repurposed For Rank Address | [CS2_n, C0] → [CS1_n, C0]<br>[CS3_n, C1] → [CS2_n, C1]<br>C2 → [CS3_n, C2] | [CS3_n, C1] → [CS1_n, C1]<br>C2 → [CS3_n, C2] |
| Limitation | No DDP Support<br>4 Rank/Channel<br>Maximum 8 Logic R/C Support:<br>1 Rank × 1-4 Stacks<br>1-4 Rank × 1 Stacks | No DDP Support<br>4 Rank/Channel<br>Maximum 8 Logic R/C Support:<br>1 Rank × 1-4 Stacks<br>1-4 Rank × 1 Stacks |
| Comment | Can have up to 8 R/C with changes in JEDEC 3D stack organization | Can have up to 8 R/C with changes in JEDEC 3D stack organization |

FIG. 3A depicts an example embodiment of a signal sequence 300 between a memory controller and a memory module to provide operational coordination as the memory module performs an in-module refresh operation according to the subject matter disclosed herein. FIG. 3B depicts another example embodiment of a signal sequence 310 between a memory controller and a memory module to provide operational coordination as the memory module performs an in-module refresh feature according to the subject matter disclosed herein.

In one embodiment, the respective signal sequences of FIGS. 3A and 3B are selectable at the initialization of the memory module. In the signal sequence of FIG. 3A, the in-module refresh operation is transparent to the memory controller because the memory module ignores an activate command in order to complete the refresh operation. From the point of view of the memory controller, it just takes a longer time for an activate command to complete and for the memory controller to issue a read or a write command. In the signal sequence of FIG. 3B, the in-module refresh operation responds to an activate command received from the memory controller by providing a feedback status message indicating that a refresh operation is in progress. In response, the memory controller may schedule other requests and/or operations and/or context switch while waiting for the activate command to complete. In one embodiment, the memory controller sends a set up command that selectively places the in-module controller in a mode in which either the signal sequence 300 or the signal sequence 310 is selected for responding to an activation command during an in-module refresh operation. In one embodiment, the specific contents of a feedback status message relating to an in-module refresh operation may be selectable at initializition of the memory module.

In FIG. 3A, the top portion depicts signals or messages sent from a memory controller (MC) to a memory module (MM), whereas the bottom portion depicts signals or messages sent from the memory module to the memory controller. At 301 in FIG. 3A, it is indicated that the memory module is performing an in-module refresh operation. At 302, the memory controller sends an activate ACT command to the memory module. While the memory module performs the in-module refresh operation, the activate command is ignored and the refresh operation is not interrupted. At 303, the memory module completes the in-module refresh operation. At 304, the memory module sends a RAS feedback status message that the memory module is ready for a read RD command. At 305, the memory controller sends a read command to the memory module. At 306, the memory module responds by outputting data corresponding to the received read command.

In FIG. 3B, the top portion depicts signals or messages sent from a memory controller to a memory module, whereas the bottom portion depicts signals sent or messages from the memory module to the memory controller. At 311 in FIG. 3B, the memory module is performing an in-module refresh operation. At 312, the memory controller sends an activate ACT command to the memory module. At 313, the memory module sends an RAS feedback status message indicating that the memory module is performing a refresh operation and for the memory controller to retry after the refresh operation completes. The memory controller may schedule other requests and/or operations and/or context switch while the refresh operation completes in order to coordinate operation with the memory module. The RAS feedback status message may include information relating to an identification of the rank/bank of the memory that is undergoing the refresh operation. At 314, the memory module completes the in-module refresh operation. At 315, the memory module sends RAS feedback status message that the refresh operation is complete. The RAS feedback status message may include an identification of the rank/bank of the memory that has completed the refresh operation. At 316, the memory controller sends an activation ACT command to the memory module. At 317, the memory module sends RAS feedback status message that the memory module is ready for a read command. At 318, the memory controller sends a read RD command to the memory module. At 319, the memory module responds by outputting data corresponding to the received read command.

FIG. 4A depicts an example embodiment of a signal sequence 400 between a memory controller and a memory module to provide operational coordination as the memory module performs an in-module ECC operation according to the subject matter disclosed herein. FIG. 4B depicts an example embodiment of a signal sequence 410 between a memory controller and a memory module to provide operational coordination as the memory module performs an in-module ECC operation and in which an error correction failure occurs according to the subject matter disclosed herein.

In the signal sequence of FIG. 4A, the in-module error-correction operation is performed by the memory module. In the signal sequence of FIG. 4B, the in-module error-correction operation is again performed by the memory module, but in this particular signal sequence, an error-correction failure occurs, and the feedback status message indicates that an error has been detected, but not corrected. In one embodiment, the specific contents of the feedback status message relating to an in-module error-correction operation may be selectable at initializition of the memory module.

In FIG. 4A, the top portion depicts signals or messages sent from a memory controller to a memory module, whereas the bottom portion depicts signals or messages sent from the memory module to the memory controller. At 401 in FIG. 4A, the memory controller sends an activate ACT command to the memory module. At 402, the memory module responds by sending an RAS feedback status message indicating that an ECC operation was performed and is ready for a read RD command. The RAS feedback status message may include the address information for the memory location in which the error was corrected. The memory controller may log the error correction event. At 403, the memory controller sends a read command. At 404, the memory module outputs data corresponding to the read command. In this signal sequence, the CPU/MC issues read and write commands in a normal manner, while ECC is performed by the memory module.

In FIG. 4B, the top portion depicts signals or messages sent from a memory controller to a memory module, whereas the bottom portion depicts signals or messages sent from the memory module to the memory controller. At 411 in FIG. 4B, the memory controller sends an activate ACT command to the memory module. At 412, the memory module responds by sending an RAS feedback status message indicating that an ECC operation failed and an error was not corrected. Additionally, the RAS feedback status message may include address information identifying the location in which the error occurred and was not corrected. At 413, the memory controller (or CPU) may log the error and/or take appropriate action. In this signal sequence, the CPU/MC issues read and write commands in a normal manner, while ECC is performed by the memory module. The memory module attempts fails to correct an error, but indicates that an error has been detected and the address of the detected error, and that the CPU/MC may take appropriate action.

Figure 5C:
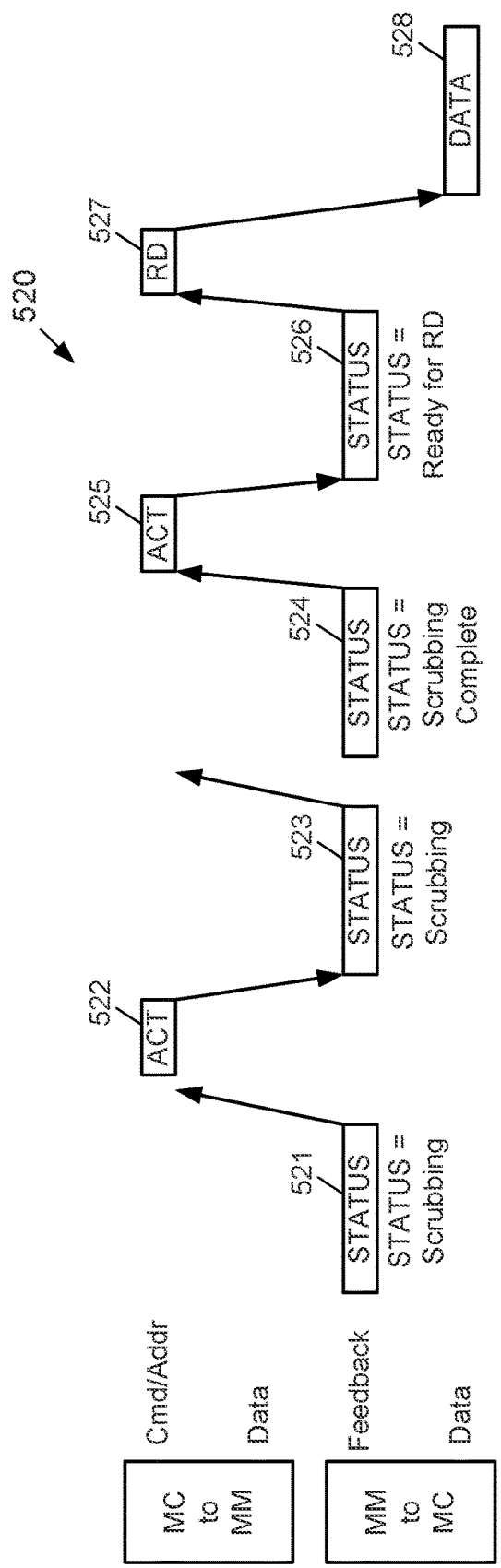
FIG. 5C depicts yet another example embodiment of a signal sequence between a memory controller and a memory module to provide operational coordination as the memory module performs an in-module scrubbing operation according to the subject matter disclosed herein.

FIG. 5A depicts an example embodiment of a signal sequence 500 between a memory controller and a memory module to provide operational coordination as the memory module performs an in-module scrubbing operation according to the subject matter disclosed herein. FIG. 5B depicts another example embodiment of a signal sequence 510 between a memory controller and a memory module to provide operational coordination as the memory module performs an in-module scrubbing operation according to the subject matter disclosed herein. FIG. 5C depicts yet another example embodiment of a signal sequence 520 between a memory controller and a memory module to provide operational coordination as the memory module performs an in-module scrubbing operation according to the subject matter disclosed herein.

In one embodiment, the respective signal sequences of FIGS. 5A-5C are selectable at the initializition of the memory module. In the signal sequence of FIG. 5A, the in-module scrubbing operation depicted is a basic operation in which the memory module provides a feedback status message indicating that a scrubbing operation is in process and when the scrubbing operation is complete. In the signal sequence of FIG. 5B, the in-module scrubbing operation includes a feedback status message indicating that a scrubbing operation is in process. The scrubbing operation may be interrupted by a normal access. The scrubbing operation resumes at the location where the scrubbing operation was interrupted, and a RAS feedback status message is sent indicating that a scrubbing operation is being performed. In the signal sequence of FIG. 5C, the in-module scrubbing operation has priority over a normal access. In response to a feedback status message indicating a scrubbing operation is in progress, the memory controller may schedule other requests and/or operations and/or context switch while waiting for the activate command to complete. In one embodiment, the specific contents of the feedback status message relating to an in-module wear-leveling operation may also be selectable at initializition of the memory module.

In FIG. 5A, the top portion depicts signals or messages sent from a memory controller to a memory module, whereas the bottom portion depicts signals or messages sent from the memory module to the memory controller. At 501 in FIG. 5A, the memory module sends an RAS feedback message to the memory controller indicating that a scrubbing operation is being performed. During a scrubbing operation, the memory module periodically reads data from a region of memory, corrects any errors using ECC, and rewrites the corrected data to the region of memory. For this embodiment of a signal sequence, the scrubbing operation has priority and while the scrubbing operation is being performed, the memory controller may log the scrubbing event. The memory controller may schedule other requests and/or operations and/or context switch during the scrubbing operation. At 502, the memory module sends an RAS feedback message to the memory controller that the scrubbing operation is complete. The memory controller may take appropriate action if the RAS feedback message indicates that the scrubbing operation is complete and also indicates that one or more errors were detected (and their respective addresses), but not corrected.

In FIG. 5B, the top portion depicts signals or messages sent from a memory controller to a memory module, whereas the bottom portion depicts signals or messages sent from the memory module to the memory controller. At 511 in FIG. 5B, the memory module sends an RAS feedback message to the memory controller indicating that a scrubbing operation is being performed. At 512, the memory controller sends an activation command to the memory module that interrupts the scrubbing operation. At 513, the memory module sends a RAS feedback status message that the memory module is ready for a read RD command. At 514, the memory controller sends a read command to the memory module. At 515, the memory module responds by outputting data corresponding to the received read command. At 516, the memory module resumes the scrubbing operation at the location where the scrubbing operation was interrupted, and sends a RAS feedback status message to the memory controller indicating that a scrubbing operation is being performed. The memory controller may interrupt the scrubbing operation again, as depicted at 512 and 513. At 517, the memory module sends an RAS feedback message to the memory controller that the scrubbing operation is complete. The memory controller may take appropriate action if the RAS feedback message indicates that the scrubbing operation is complete also indicates that one or more errors were detected (and their respective addresses), but not corrected.

In FIG. 5C, the top portion depicts signals or messages sent from a memory controller to a memory module, whereas the bottom portion depicts signals or messages sent from the memory module to the memory controller. At 521 in FIG. 5C, the memory module sends an RAS feedback message to the memory controller indicating that a scrubbing operation is being performed. For this embodiment of a signal sequence, the scrubbing operation has priority and while the scrubbing operation is being performed. The memory controller may log the scrubbing event and may schedule other requests and/or operations and/or context switch. At 522, the memory controller sends an activation command to the memory module. At 523, the memory module sends an RAS feedback status message to the memory controller indicating that the scrubbing operation is being performed. The RAS feedback status message may include information indicating a length of time (latency) before the scrubbing operation is complete. The memory controller may wait based on the indicated latency or may context switch. At 524, the memory module sends an RAS feedback message to the memory controller that the scrubbing operation is complete. The memory controller may take appropriate action if the RAS feedback status message indicates that the scrubbing operation is complete and also indicates that one or more errors were detected (and their respective addresses), but not corrected. At 525, the memory controller sends an activation command to the memory module. At 526, the memory module sends an RAS feedback status message that the memory module is ready for a read command. At 527, the memory controller sends a read RD command to the memory module. At 528, the memory module responds by outputting data corresponding to the received read command.

Figure 6A:
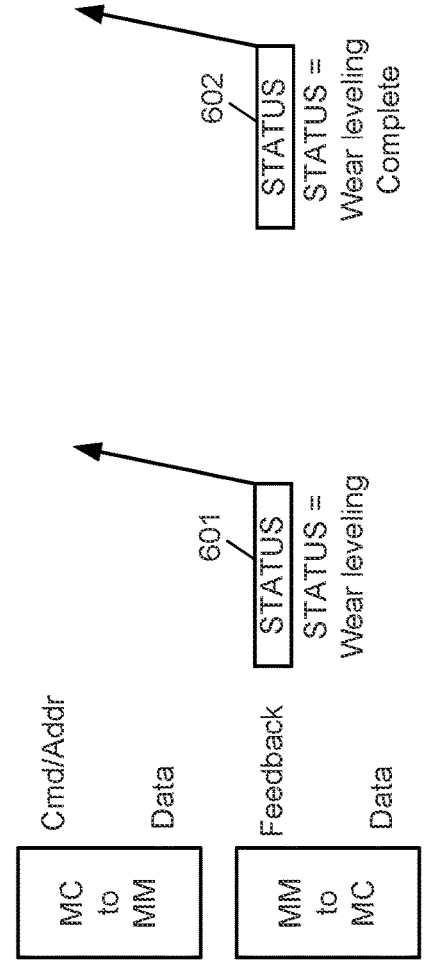
FIG. 6A depicts an example embodiment of a signal sequence between a memory controller and a memory module to provide operational coordination as the memory module performs an in-module wear-leveling operation according to the subject matter disclosed herein.
Figure 6B:
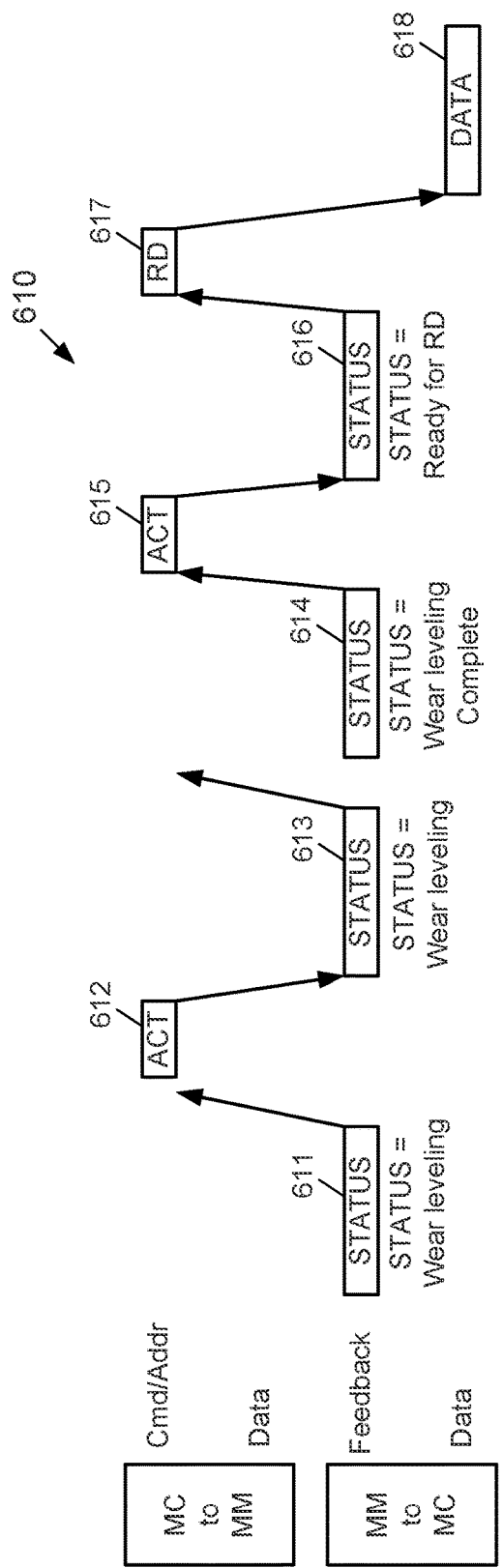
FIG. 6B depicts another example embodiment of a signal sequence between a memory controller and a memory module to provide operational coordination as the memory module performs an in-module scrubbing operation according to the subject matter disclosed herein.

FIG. 6A depicts an example embodiment of a signal sequence 600 between a memory controller and a memory module to provide operational coordination as the memory module performs an in-module wear-leveling operation according to the subject matter disclosed herein. FIG. 6B depicts another example embodiment of a signal sequence 610 between a memory controller and a memory module to provide operational coordination as the memory module performs an in-module scrubbing operation according to the subject matter disclosed herein.

In one embodiment, the respective signal sequences of FIGS. 6A and 6B are selectable at the initialization of the memory module. In the signal sequence of FIG. 6A, the in-module wear-leveling operation depicted has priority over normal accesses. The memory module sends a feedback status message indicating a wear-leveling operation is in progress, and the memory controller may schedule other requests and/or operations and/or context switch while waiting for the activate command to complete. In the signal sequence of FIG. 6B, the in-module wear-leveling operation provides a feedback status message indicating a wear-leveling operation is in process in response to an activate command, but the wear-leveling operation has priority, and the wear-leveling operation is not interrupted. In response to a feedback status, the memory controller may schedule other requests and/or operations and/or context switch while waiting for the activate command to complete. A feedback status message is sent by the memory module when the wear-leveling operation is complete, and the memory controller may begin a normal access. In one embodiment, the specific contents of the feedback status message relating to an in-module wear-leveling operation may be selectable at initializition of the memory module.

In FIG. 6A, the top portion depicts signals or messages sent from a memory controller to a memory module, whereas the bottom portion depicts signals or messages sent from the memory module to the memory controller. At 601 in FIG. 6A, the memory module sends an RAS feedback message to the memory controller indicating that a wear-leveling operation is being performed. During a wear-leveling operation, the memory module remaps memory pages of a non-volatile memory using, for example, a write-count table and a remap table to swap memory pages to balance wear in the non-volatile memory. For this embodiment of a signal sequence, the wear-leveling operation has priority. While the wear-leveling operation is being performed, the memory controller may log the wear-leveling event. Additionally, the memory controller may schedule other requests and/or operations. At 602, the memory module sends an RAS feedback message to the memory controller that the wear-leveling operation is complete.

In FIG. 6B, the top portion depicts signals or messages sent from a memory controller to a memory module, whereas the bottom portion depicts signals or messages sent from the memory module to the memory controller. At 611 in FIG. 6B, the memory module sends an RAS feedback message to the memory controller indicating that a wear-leveling operation is being performed. For this embodiment of a signal sequence, the wear-leveling operation has priority and while the wear-leveling operation is being performed, the memory controller may log the wear-leveling event and may schedule other requests and/or operations and/or context switch. At 612, the memory controller sends an activation command to the memory module. At 613, the memory module sends an RAS feedback status message to the memory controller indicating that the wear-leveling operation is being performed and to retry after the wear-leveling operation is complete. The RAS feedback message may include information indicating a length of time (latency) before the wear-leveling operation is complete. The memory controller may wait based on the indicated latency or may context switch. At 614 in this signal sequence, the memory module sends an RAS feedback message to the memory controller that the wear-leveling operation is complete. At 615, the memory controller sends an activation command to the memory module. At 616, the memory module sends an RAS feedback status message that the memory module is ready for a read command. At 617, the memory controller sends a read RD command to the memory module. At 618, the memory module responds by outputting data corresponding to the received read command.

Table 2 includes example information that may be contained in an RAS feedback status message along with potential corresponding actions that may be taken by a CPU/MC (i.e., a host).

TABLE 2

Example RAS Status Information

Notification of invalid access:

Due to cache read miss (host action: wait for NVM access)
Due to refresh (host action: wait for refresh completion or NVM access)
Due to wear leveling (host action: retry after NVDIMM specified time)
Due to garbage collection (host action: retry after NVDIMM specified time
Due to data migration to spared memory (host action: retry after NVDIMM specified time
Due to unrecoverable error
Reports Log:

Number of error detected
Number of errors corrected
Number of write failures
Number of failed ranks
Number of wear leveling events
Number of garbage collection events Referring back to the example in which five (5) connector pins are repurposed, an example RAS feedback status message that may be conveyed by the five repurposed connector pins and that uses four (4) cycles may be arranged as shown in Table 3.

TABLE 3

An example of an RAS feedback status message.

| Bit     | 4    | 3        | 2         | 1         | 0      |
|---------|------|----------|-----------|-----------|--------|
| Cycle 0 | Sync |          | TID[5:4]  | Success   | Parity |
| Cycle 1 |      |          | TID[3:0]  |           | Parity |
| Cycle 2 |      | Status Code Type [1:0] | | Status Code [5:4] | Parity |
| Cycle 3 |      |          | Status Code [3:0] |   | Parity |

In the example RAS feedback status message shown in Table 3, Sync indicates that the RAS status message is a new feedback packet. TID indicates a transaction identification (ID), which may be similar to an address. Parity indicates information that may be used to protect the RAS feedback status message. It should be understood that the identification of the five pins that have been repurposed for the RAS feedback status message of Table 3 may be defined as convenient.

Tables 4-7 include additional example information that may be contained in an RAS feedback status message.

TABLE 4

Example RAS feedback status message information.

| Success | Status Code Type [1:0] | Status Code (Operations) [5:3] | Status Code (Retry) [2:1] | Description |
|---------|------------------------|-------------------------------|---------------------------|-------------|
| 0x0     | 0x00                   | 0x000                         | 0x00                      | Fatal error in the Memory with specific TID |
|         |                        |                               | 0x01-0x11                 | RFU |
|         |                        |                               | 0x00-0x11                 | RFU |
|         | 0x01                   | 0x000                         | 0x00-0x11                 | RFU |
|         |                        | 0x001                         | 0x00                      | Activation Failure with uncorrectable Error |
|         |                        |                               | 0x01-0x11                 | RFU |
|         |                        | 0x010                         | 0x00                      | Activation Failure after GC (Capacity Failure, fatal) |
|         |                        |                               | 0x01                      | RFU |
|         |                        |                               | 0x10                      | Activation Failure because of GC, retry with small latency |
|         |                        |                               | 0x11                      | Activation Failure because of GC, retry with large latency |
|         |                        | 0x011                         | 0x00                      | Activation Failure after WL (Capacity Failure, fatal) |
|         |                        |                               | 0x01                      | RFU |
|         |                        |                               | 0x10                      | Activation Failure because of WL, retry with small latency |
|         |                        |                               | 0x11                      | Activation Failure because of WL, retry with large latency |

TABLE 4-continued

Example RAS feedback status message information.

| Success | Status Code Type [1:0] | Status Code (Operations) [5:3] | Status Code (Retry) [2:1] | Description |
|---|---|---|---|---|
| | | 0x100 | 0x00-0x01 | RFU |
| | | | 0x10 | Activation Failure because of Refresh, retry with small latency |
| | | | 0x11 | Activation Failure because of Refresh, retry with large latency |
| | | 0x101-0x11 | 0x00-0x11 | RFU |

TABLE 5

Example RAS feedback status message information.

| Success | Status Code Type [1:0] | Status Code (Operations) [5:3] | Status Code (Retry) [2:1] | Description |
|---|---|---|---|---|
| 0x0 | 0x10 | 0x000 | 0x00-0x11 | RFU |
| | | 0x001 | 0x00 | Write Failure with Uncorrectable Error |
| | | | 0x01-0x11 | RFU |
| | | 0x010 | 0x00 | Write Failure after GC (Capacity Failure, fatal) |
| | | | 0x01 | RFU |
| | | | 0x10 | Write Failure because of GC, retry with small latency |
| | | | 0x11 | Write Failure because of GC, retry with large latency |
| | | 0x011 | 0x00 | Write Failure after WL (Capacity Failure, fatal) |
| | | | 0x01 | RFU |
| | | | 0x10 | Write Failure because of WL, retry with small latency |
| | | | 0x11 | Write Failure because of WL, retry with large latency |
| | | 0x100 | 0x00-0x01 | RFU |
| | | | 0x10 | Write Failure because of Refresh, retry with small latency |
| | | | 0x11 | Write Failure because of Refresh, retry with large latency |
| | | 0x101-0x111 | 0x00-0x11 | RFU |
| 0x11 | | 0x000 | 0x00-0x11 | RFU |
| | | 0x001 | 0x00 | Act + Write Failure with Uncorrectable Error |
| | | | 0x01-0x11 | RFU |
| | | 0x010-0x111 | 0x01-0x11 | RFU |

TABLE 6

Example RAS feedback status message information.

| Success | Status Code Type [1:0] | Status Code [5:1] | Description |
|---|---|---|---|
| 0x1 | 0x00 | 0x00000 | Memory with specific TID is ready |
| | | 0x00001-0x11111 | RFU |
| | 0x01 | 0x00000 | Activation Success w/o Error |
| | | 0x00100 | Activation Success with Correctable Error |
| | | 0x01000 | Activation Success after GC |
| | | 0x01100 | Activation Success after WL |
| | | 0x10000 | Activation Success after Refresh |
| | | Others | RFU |

TABLE 7

Example RAS feedback status message information.

| Success | Status Code Type [1:0] | Status Code [4:0] | Description |
|---|---|---|---|
| 0x1 | 0x10 | 0x00000 | Write Success w/o Error |
| | | 0x00100 | Write Success with Correctable Error |
| | | 0x01000 | Write Success after GC |
| | | 0x01100 | Write Success after WL |
| | | 0x1000 | Write Success after Refresh |
| | | Others | RFU |
| | 0x11 | 0x00000 | ACT + Write Success |
| | | 0x00100 | ACT + Write Success w/Correctable Error |
| | | 0x01000 | ACT + Write Success after GC |
| | | 0x01100 | ACT + Write Success after WL |
| | | 0x1000 | ACT + Write Success after Refresh |
| | | Others | RFU |

Figure 7:
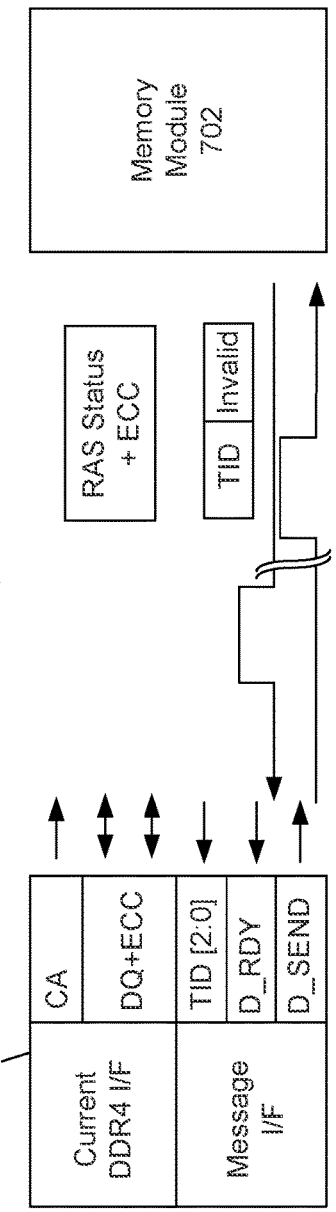
FIG. 7 depicts an example embodiment of an interface between a CPU/MC and a memory module in which a RAS feedback status message is communicated via a DQ (data) bus according to the subject matter disclosed herein.

FIG. 7 depicts an example embodiment of an interface 700 between a CPU/MC 701 and a memory module 702 in which a RAS feedback status message is communicated via a DQ (data) bus according to the subject matter disclosed herein. FIG. 8 depicts a flow diagram 800 of a method in which an RAS feedback status message is communicated via a DQ bus according to the subject matter disclosed herein. In this alternative example embodiment, one repurposed connector pin may be used at operation 801 in FIG. 8 to send a D_RDY feedback signal that is used by the memory module 702 to request attention from the CPU/MC 701. After the CPU/MC 701 receives D_RDY feedback signal, at operation 802 the CPU/MC701 sends a D_SEND signal over a second repurposed connector pin to pull the RAS feedback status information from the memory module 702 at operation 803. Three repurposed pins are used to communicate TID. In this alternative example embodiment, the RAS feedback status message is communicated via the DQ bus. The relative size of the DQ bus allows numerous information bits to be communicated from the memory module to the CPU/MC.

In another example embodiment, the host (i.e., the system CPU/MC) may proactively request the RAS feedback status information of a memory module by sending a special Mode Register Set (MRS) command. FIG. 9 depicts a flow diagram of a method 900 of using an MRS command to configure a memory module to read an RAS feedback status message according to the subject matter disclosed herein. The MRS command is conventionally defined for a DDR4 DIMM, however, according to the subject matter disclosed herein, unused bits in the MRS command may be programmed to signal, or trigger, the memory module to enter a special mode, referred to herein as the MPR read mode, which is also a mode that is conventionally defined for a DDR4 DIMM. At 901, the host sends an MRS (MR3) command to the memory module. At 902, the host sends a Read (RD) command to the memory module. At 903, the memory module returns an Invalid+Log message instead of normal data. At 904, the CPU/MC host issues another MRS command that is configured to signal, or trigger, the memory module to exit the special MPR mode.

Figure 10:
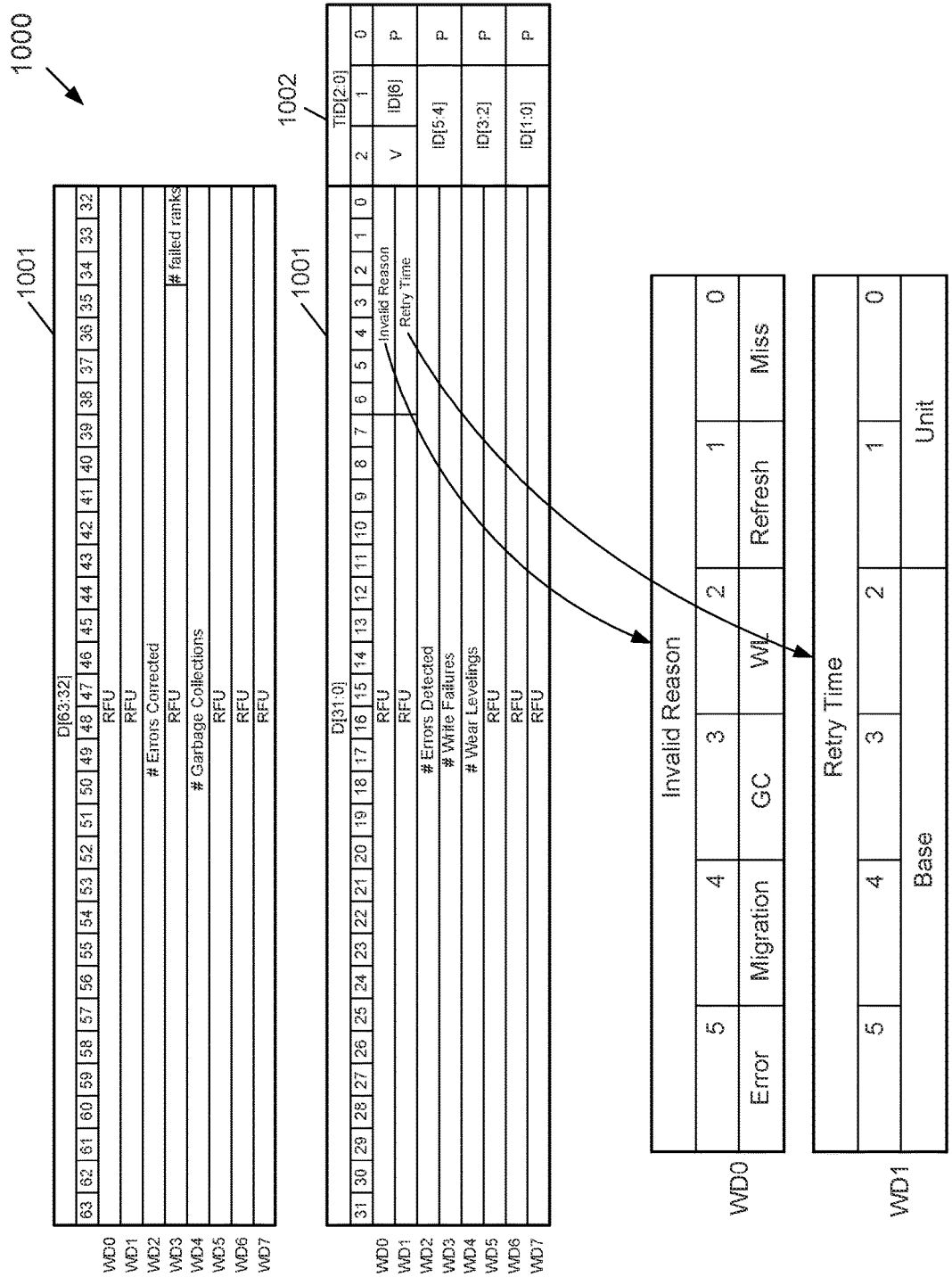
FIG. 10 depicts an example arrangement of an RAS feedback status message if a DQ bus is used to communicate the feedback status information according to the subject matter disclosed herein.

FIG. 10 depicts an example arrangement of an RAS feedback status message 1000 if a DQ bus is used to communicate the feedback status information according to the subject matter disclosed herein. As depicted in FIG. 10, eight 64-bit words WD0-WD7 are output from the memory module over the DQ bus as indicated at 1001, and four 3-bit words are output from the memory module as a TID+Invalid message, indicated at 1002. The 3-bit words may be communicated via repurposed connector pins.

Bits [6:0] of the first two 64-bit words WD0 and WD1 respectively contain an Invalid Reason code and a Retry Time code. Bit 5 of the Invalid Reason code indicates whether an error has occurred. Bit 4 of the Invalid Reason code indicates whether a migration is occurring. Bit 3 of the Invalid Reason code indicates whether a garbage collection (GC) operation is occurring. Bit 2 of the Invalid Reason code indicates whether a wear-leveling (WL) operation is occurring. Bit 1 of the Invalid Reason code indicates whether a refresh operation is occurring. Bit 0 of the Invalid Reason code indicates whether a miss has occurred.

Bits 5-2 of the Retry Time code indicate a binary base multiplier, and bits 1-0 of the Retry Time code indicate the units of time that are multiplied by the base multiplier. In one embodiment, a units code of a binary 00 represents a base time of 100 ns; a units code of a binary 01 represents a base time of 1 μs; a units code of a binary 10 represents a base time of 10 μa; and a units code of a binary 11 represents a base time of 100 μs. For example, if bits 5-2 of the Retry Time code are a binary 0100 (i.e., decimal 4), and the units code is a binary 00, then the Retry Time code indicates a retry time of 400 ns.

In another embodiment, the ALERT_n connector pin may be used as a D_RDY signal if the memory module is in a NVDIMM-P mode by adding a timing definition to the existing ALERT_n connector. In the existing DDR4 specification, the ALERT_n signal is used for signaling the occurrence of two types of errors: a write cyclic redundancy check (CRC) error, and a command address (CA) parity error. These two errors are distinguishable by the pulse width of the ALERT_n signal. For example, if a write CRC error occurs, under the DDR4-2400 specification the memory module causes the ALERT_n signal to go LOW for between about 6 to about 10 clock cycles. If a command address (CA) parity error occurs, under the DDR4-2400 specification, the memory module causes the ALERT_n signal to go LOW for between about 72 to about 144 clock cycles. According to the subject matter disclosed herein, a short ALERT_n pulse width of between about 2 and about 3 cycles may be used to represent a D_RDY signal, thereby allowing the ALERT_n signal to function in accordance with the DDR4-2400 specification for an occurrence of a write CRC and for a CA parity. In one embodiment, if the ALERT_n signal is used for D_RDY, the D_RDY will always have the lowest priority so that detection of an occurrence of a write CRC or a CA parity is ensured.

Table 8 sets forth connector pins for a memory module in a DRAM DIMM mode and in a NVDIMM-P mode according to one embodiment of the subject matter disclosed herein. As shown in Table 8, if the memory module is in the DRAM DIMM mode, the ALERT_n*pin (pin 208) operates in a well-known manner to provide a transmit (Tx) and a receive (Rx) function from the point of view of a memory controller. Signals CS_n[1], ODT[1] and CKE[1] (pins 89, 91 and 203, respectively) also operate in a well-known manner to provide a transmit function from the point of view of the memory controller. If the memory module is in the NVDIMM-P mode, pin 208 is defined as an ALERT_n/D_RDY signal, and provides both a transmit (Tx) and a receive (Rx) function from the point of view of the memory controller. Pins 89, 91 and 203 are defined as MSG[2:0] and provide a receive function from the point of view of the memory controller. In one embodiment, the ALERT_n/D_RDY signal and the MSG[2:0] may operate at a single data rate. In another embodiment, the ALERT_n/D_RDY signal and the MSG[2:0] may operate at DDR.

TABLE 8

Connector pins for a memory module in a DRAM DIMM mode and in a NVDIMM-P mode.

| | DRAM DIMM Mode | | NVDIMM-P Mode | |
|---|---|---|---|---|
| PIN | Name | Tx, Rx | Name | Tx, Rx |
| 89 | CS_n[1] | Tx | MSG[2:0] | Rx |
| 91 | ODT[1] | Tx | | |
| 203 | CKE[1] | Tx | | |
| 208 | ALERT_n* | Tx/Rx | ALERT_n/D_RDY | Tx/Rx |

Table 9 sets forth the timing and message definition for the ALERT_n connector pin if used as a D_RDY signal in the NVDIMM-P mode according to the subject matter disclosed herein. In the NVDIMM-P mode, a pulse width of the ALERT_n connector pin is defined to be between about 2 and about 3 clock cycles for a D_RDY signal. For a pulse width of between about 6 and 10 clock cycles, the ALERT_n connector pin is defined as an occurrence of a Write CRC error, and for a pulse width of between 72 and 144 clock cycles, the ALERT_n connector pin is defined as an occurrence of a command address (CA) parity error.

TABLE 9

Timing and message definition for the ALERT_n connector pin if used as a D_RDY signal in the NVDIMM-P mode

| ALERT_n Pulse Width | Definition |
|---|---|
| 2~3 | D_RDY (for NVDIMM-P Mode) |
| 6~10 | Write CRC error |
| 72~144 | CA parity error |

Figures 11, 12:
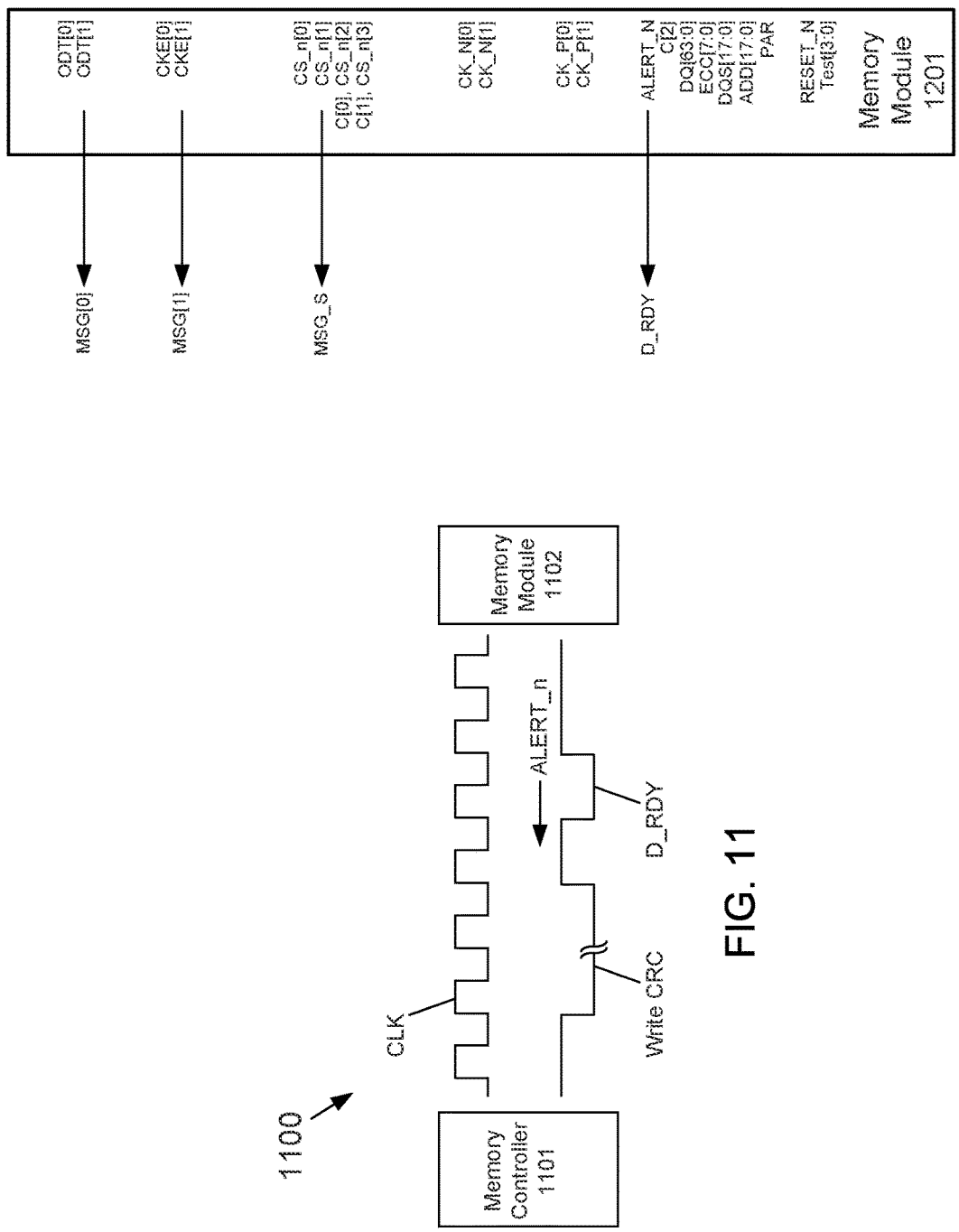
FIG. 11 depicts an example of a signal diagram for an ALERT_n pin being used as a D_RDY signal according to the subject matter disclosed herein.
FIG. 12 depicts pinouts of another example embodiment of a memory module connector in a memory channel in which selected pins have been repurposed to communicate status information, such as, but not limited to, cache information, associated with the D_RDY signal according to the subject matter disclosed herein.

In one embodiment, ALERT_n pin should be HIGH for at least one cycle before being used as a D_RDY signal. Additionally, the Alert_n pin should be HIGH for at least one cycle after each D_RDY signal so that can be recognized by a host system. FIG. 11 depicts an example of a signal diagram 1100 for an ALERT_n pin being used as a D_RDY signal according to the subject matter disclosed herein. In FIG. 11, signal flow is indicated as being from a memory module 1102 toward a memory controller 1101.

FIG. 12 depicts pinouts of another example embodiment of a memory module connector in a memory channel 1200 in which selected pins have been repurposed to communicate status information, such as, but not limited to, cache information, associated with the D_RDY signal according to the subject matter disclosed herein. In particular, FIG. 12 depicts pinouts of an example embodiment of one memory module 1201 of a communication channel 1200 in which three (3) pins of the memory module connectors have been repurposed to communicate status information, such as, but not limited to, cache information, to a memory controller (not shown), to a CPU (not shown) or to a CPU having an integral memory controller (not shown).

As depicted in FIG. 12, three example connector pins ODT[1], CKE[1] and CS_n[1] have been repurposed to communicate cache status information to the memory controller. It should be understood that other connector pins of a memory module could be repurposed to communicate cache status information to a memory controller according to the subject matter disclosed herein. In another embodiment, example connector pins ODT[1] and CKE[1] are used to communicate cache status information respectively as MSG[0] and MSG[1] so that the message is two bits wide, but includes a message strobe signal MSG_S to enable a double data rate (DDR).

In one embodiment, a dedicated pin is not used for D_SEND. Instead, an undefined DDR4 command for D_SEND is used and is referred to herein as a Transaction Burst (TB) command, which initiates a transaction data burst, in order to provide the same functionality by using existing command and address pins. The Transaction Burst command is operative in the NVM direct mode and the DRAM+NVM Cache mode. Table 10 sets forth the definition of the Transaction Burst command.

TABLE 10

The Transaction Burst Command.

| Transaction Burst | Function |
| --- | --- |
| 1$^{st}$ clock | CKE Previous Cycles |
| H | CKE Current Cycles |
| H | ACT_n |
| H | RAS_n/A16 |
| L | CAS_n/A15 |
| H | WE_n/A14 |
| H | BG0-BG1 |
| L | BA0-BA1 |
| L | C0-C2 |
| H | BC_n/A12 |
| RFU | A17; A13; A11, A10 |
| Burst Count | A9-A0 |

Figure 13:
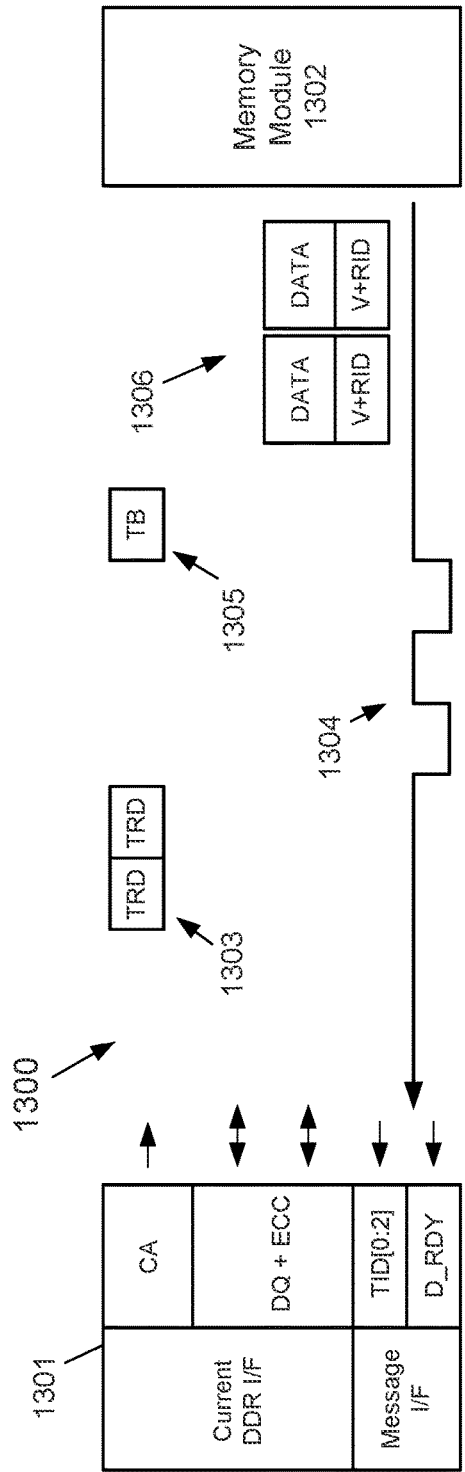
FIG. 13 depicts a signal flow for a Transaction Burst (TB) command according to the subject matter disclosed herein.

FIG. 13 depicts a signal flow 1300 for a Transaction Burst Command according to the subject matter disclosed herein. As depicted in FIG. 13, a host 1301 may send two TRD commands at 1303 to a memory module 1302 on the CA bus. The memory module 1302 responds by indicating that two reads are ready to be fetched at 1304. Later in time, the host 1301 then sends a TB command at 1305, indicating to the memory module 1302 form two bursts 1306 out the two pieces of data. Each data is attached includes a Valid (V) bit and a corresponding ID (RID). Unless the host receives a D_RDY signal, the host does not issue a TB command. The time between the TB command and the return of data may be fixed and, in one embodiment, may be the same as tSND.

Figure 14:
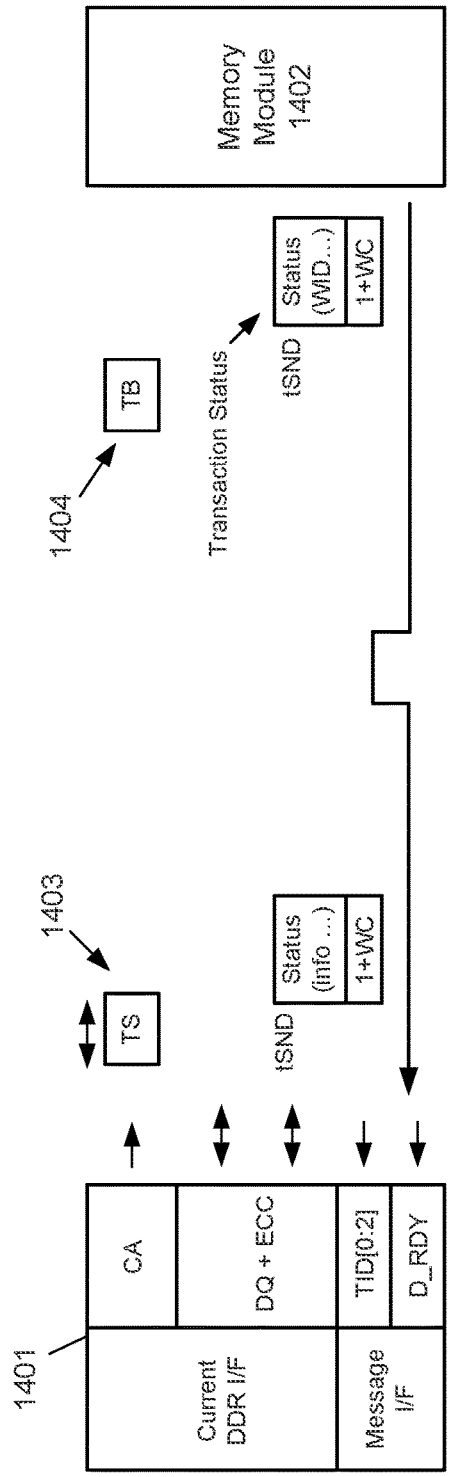
FIG. 14 depicts a signal flow for a Transaction Status (TS) message according to the subject matter disclosed herein.

FIG. 14 depicts a signal flow 1400 for a Read Status (RS) message according to the subject matter disclosed herein. Similar to the embodiment described in connection with FIGS. 7-9, a host can proactively read status information from a memory module, or a memory module 1402 can proactively request attention from a host 1401 using a tSN message and send status information to the host 1401, as depicted in FIG. 14. If the host 1401 wants to read status of a memory module 1402, the host sends a RS command at 1403. If the memory module 1402 wants attention from the host 1401, the memory module 1402 sends a D_RDY signal (not indicated in FIG. 14), and at 1404 the host 1401 sends a TB command to the memory module 1402 to read status.

In one embodiment, the definition of the RAS feedback status information may be the same as described in connection with FIGS. 7-9. In addition to the RAS feedback status information, a status information message may also include write credit (WC) and write ID (WID) information so that the memory module may return the information for write status (e.g., whether a write is successful by checking the WID, or whether there is sufficient space to accept more write data by checking WC). In one embodiment, CRC may be used for packet integrity protection.

The host 1401 may distinguish normal data packets and status packets by reading "MSG[0], cycle 1". That is, if the MSG[0] bit is "0," then the host 1401 will decode the a packet as normal data. If the MSG[0] bit is "1," the host 1401 will decode the packet as a status packet.

In one embodiment, a Read Status message may be defined as set forth in Table 11.

TABLE 11

Read Status Message.

| Read Status | Function |
| --- | --- |
| H | CKE Previous Cycle |
| H | CKE Current Cycle |
| H | ACT_n |
| L | RAS_n/A16 |
| H | CAS_n/A15 |
| H | WE_n/A14 |
| L | BG0-BG1 |
| H | BA0-BA1 |
| L | C0-C2 |
| RFU | BC_n/A12 |
|  | A17, A13, A11, A10 |
|  | A9-A0 |

Table 12 sets forth an example definition of a Read Status Packet according to the subject matter disclosed herein.

TABLE 12

Read Packet - "Read Status"
Transaction Packet - "Read Status"

|  | Cycle 1 | Cycle 2 | Cycle 3 | Cycle 4 |
| --- | --- | --- | --- | --- |
| DQ[63:0] ECC[7:0] | WID0~WID7, RAS, CRC | | | |
| MSG[0] | 1 | WC[5] | WC[3] | WC[1] |
| MSG[1] | WC[6] | WC[4] | WC[2] | WC[0] |
| MSG[2] | CRC | CRC | CRC | CRC |

Figure 15:
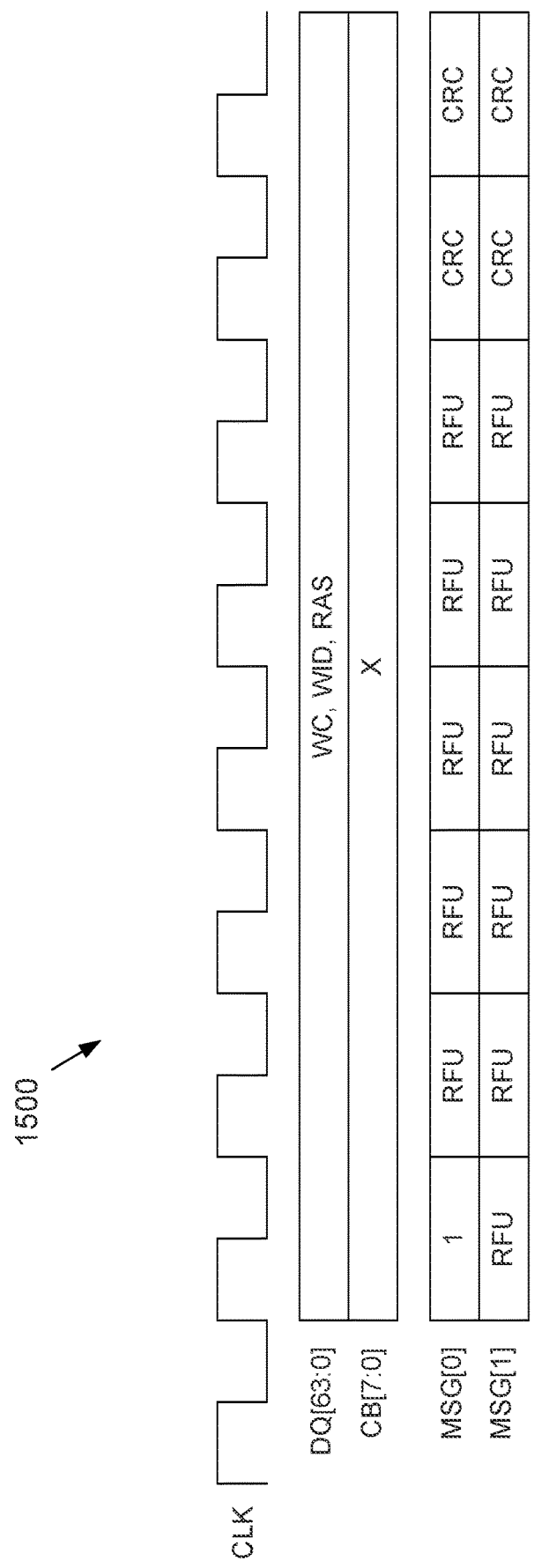
FIG. 15 depicts an example arrangement of an Read Status (RS) return message according to the subject matter disclosed herein.

In one embodiment, a Read Status (RS) command may be used to read status of a memory module, including Write Credit (WC) and memory module response information. The Read Status command may be available in the NVM Direct mode and in the DRAM+NVM Cache mode. FIG. 15 depicts an example arrangement of a Read Status (RS) return message according to the subject matter disclosed herein.

Figure 16:
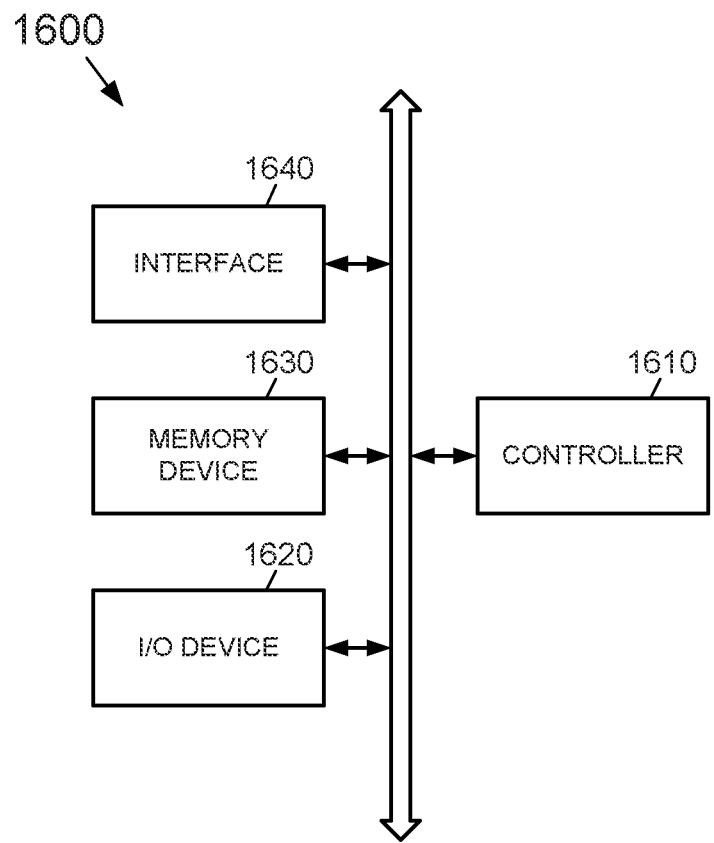
FIG. 16 depicts an electronic device that comprises a memory module that supports and/or manages in-module refresh features, in-module ECC functionality, in-module scrubbing, and/or in-module wear-leveling management and provides operational coordination with a host device according to embodiments disclosed herein.

FIG. 16 depicts an electronic device 1600 that comprises a memory module that supports and/or manages in-module refresh features, in-module ECC functionality, in-module scrubbing, and/or in-module wear-leveling management and provides operational coordination with a host device according to embodiments disclosed herein. Electronic device 1600 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 1600 may comprise a controller 1610, an input/output device 1620 such as, but not limited to, a keypad, a keyboard, a display, or a touch-screen display, a memory 1630, and a wireless interface 1640 that are coupled to each other through a bus 1650. The controller 1610 may comprise, for example, at least one microprocessor, at least one digital signal process, at least one microcontroller, or the like. The memory 1630 may be configured to store a command code to be used by the controller 1610 or a user data. In one embodiment, the memory 1630 comprises a memory module that supports and/or manages in-module refresh features, in-module ECC functionality, in-module scrubbing, and/or in-module wear-leveling management and provides operational coordination with a host device according to the embodiments disclosed herein. The electronic device 1600 may use a wireless interface 1640 configured to transmit data to or receive data from a wireless communication network using a RF signal. The wireless interface 1640 may include, for example, an antenna, a wireless transceiver and so on. The electronic system 1600 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service—Time Division Duplex (UMTS-TDD), High Speed Packet Access (HSPA), Evolution Data Optimized (EVDO), Long Term Evolution—Advanced (LTE-Advanced), Multichannel Multipoint Distribution Service (MMDS), and so forth.

Figure 17:
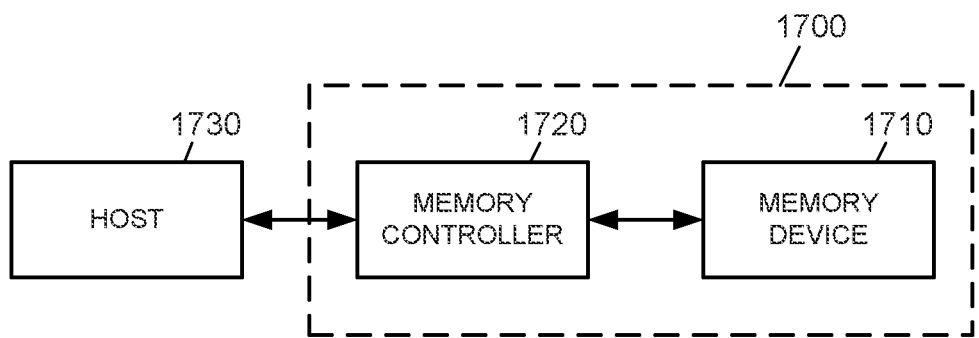
FIG. 17 depicts a memory system that may comprise a memory module that supports and/or manages in-module refresh features, in-module ECC functionality, in-module scrubbing, and/or in-module wear-leveling management and provides operational coordination with a host device according to embodiments disclosed herein.

FIG. 17 depicts a memory system 1700 that may comprise a memory module that supports and/or manages in-module refresh features, in-module ECC functionality, in-module scrubbing, and/or in-module wear-leveling management and provides operational coordination with a host device according to embodiments disclosed herein. The memory system 1700 may comprise a memory device 1710 for storing large amounts of data and a memory controller 1720. The memory controller 1720 controls the memory device 1710 to read data stored in the memory device 1710 or to write data into the memory device 1710 in response to a read/write request of a host 1730. The memory controller 1730 may include an address-mapping table for mapping an address provided from the host 1730 (e.g., a mobile device or a computer system) into a physical address of the memory device 1710. The memory device 1710 may comprise a memory module that supports and/or manages in-module refresh features, in-module ECC functionality, in-module scrubbing, and/or in-module wear-leveling management and provides operational coordination with a host device according to embodiments disclosed herein.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A method comprising:
   receiving, by a controller, a command using an interface, the interface comprising a connection based on an in-line memory module terminal configuration to provide feedback status information of a memory array; and
   controlling, by the controller, the interface to provide feedback status information using the interface based on a result of an error-correction operation of the memory array.

2. The method of claim 1, further comprising:
   controlling, by the controller, a refresh operation of the memory array, and
   controlling, by the controller, the interface to provide feedback status information based on the refresh operation.

3. The method of claim 1, further comprising:
   controlling, by the controller, a refresh operation of the memory array, and
   controlling, by the controller, the interface to provide feedback status information based on a status of the refresh operation.

4. The method of claim 3, wherein the feedback status information indicates a status of a rank identification for a refresh operation.

5. The method of claim 3, wherein the feedback status information indicates a status of a bank identification for a refresh operation.

6. The method of claim 1, further comprising:
   controlling, by the controller, a scrubbing operation of the memory array, and
   controlling, by the controller, the interface to provide feedback status information based on the scrubbing operation.

7. The method of claim 1, wherein the memory array comprises non-volatile memory,
   the method further comprising:
   controlling, by the controller, a wear-leveling operation of the memory array, and
   controlling, by the controller, the interface to provide feedback status information device based on the wear-leveling operation.

8. A method, comprising:
   controlling, by a controller, a wear-leveling operation of a memory array, the memory array comprising an array of memory cells, the array of memory cells comprising volatile memory and non-volatile memory, the memory array configured as a memory module; and
   providing, by the controller, using an interface comprising a connection based on an in-line memory module terminal configuration, feedback status information based on the wear-leveling operation.

9. The method of claim 8, further comprising providing, by the controller, using the interface, scheduling information based on the wear-leveling operation.

10. The method of claim 8, further comprising:
controlling, by the controller, a refresh operation of the memory array, and
providing, by the controller, using the interface, feedback status information based on the refresh operation.

11. The method of claim 8, further comprising:
controlling, by the controller, an error-correction operation of the memory array, and
providing, by the controller, feedback status information based on the error-correction operation and that indicates a result of the error-correction operation.

12. The method of claim 11, further comprising:
controlling, by the controller, a scrubbing operation of the memory array, and
providing, by the controller, using the interface, feedback status information based on the scrubbing operation.

13. The method of claim 8, wherein the connection is repurposed from the in-line memory module terminal configuration.

14. A method, comprising:
controlling, by a controller, using an interface, an operation of a memory array, wherein the memory array is configured as a memory module, and the memory module comprises a connection based on an in-line memory module terminal configuration;
receiving, by the controller, using the interface, a command, wherein the controller is configured to provide, using the connection, an operational status of the memory array; and
providing, by the controller, using the interface, feedback status information based on the command relating to an operation controlled by the controller.

15. The method of claim 14, wherein the operation comprises at least one of a refresh operation of a memory array, an error-correction operation of the memory array, a memory scrubbing operation of the memory array, or a wear-leveling operation of the memory array.

16. The method of claim 14, wherein the controller controls a refresh operation of the memory array, and the method further comprises controlling, by the controller, the interface based on the refresh operation of the memory array to provide the feedback status information based on the refresh operation.

17. The method of claim 14, wherein the controller controls an error-correction operation of the memory array, and the method further comprises controlling, by the controller, the interface to provide the feedback status information indicating a result of the error-correction operation.

18. The method of claim 17, further comprising controlling, by the controller, the interface to provide feedback status information that indicates an action based on the result of the error-correction operation.

19. The method of claim 14, wherein the controller controls a memory scrubbing operation of the memory array, and the method further comprises controlling, by the controller, the interface to provide the feedback status based on the memory scrubbing operation.

20. The method of claim 14, wherein the memory array comprises a plurality of non-volatile memory cells, the controller controls a wear-leveling operation of the memory array, and the method further comprises controlling, by the controller, the interface to provide the feedback status information based on the wear-leveling operation.

\* \* \* \* \*